(12) United States Patent
Poelzl et al.

(10) Patent No.: US 8,093,654 B2
(45) Date of Patent: Jan. 10, 2012

(54) VERTICAL TRANSISTOR COMPONENT

(75) Inventors: Martin Poelzl, Ossiach (AT); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/834,000

(22) Filed: Jul. 11, 2010

(65) Prior Publication Data
US 2010/0270612 A1 Oct. 28, 2010

Related U.S. Application Data

(62) Division of application No. 11/241,867, filed on Sep. 30, 2005, now Pat. No. 7,767,527.

(30) Foreign Application Priority Data

Sep. 30, 2004 (DE) .......................... 10 2004 047 627

(51) Int. Cl.
*H01L 29/78* (2006.01)

(52) U.S. Cl. .................. 257/330; 257/332; 257/E29.262
(58) Field of Classification Search .................. 257/328, 257/E29.067, 330, 332, E29.262
See application file for complete search history.

(56) References Cited

U.S. PATENT DOCUMENTS 6,906,380 B1 * 6/2005 Pattanayak et al. ........... 257/331
* cited by examiner

*Primary Examiner* — Mary Wilczewski
*Assistant Examiner* — Toniae Thomas
(74) *Attorney, Agent, or Firm* — Maginot Moore & Beck

(57) ABSTRACT

A method for producing a vertical transistor component includes providing a semiconductor substrate, applying an auxiliary layer to the semiconductor substrate, and patterning the auxiliary layer for the purpose of producing at least one trench which extends as far as the semiconductor substrate and which has opposite sidewalls. The method further includes producing a monocrystalline semiconductor layer on at least one of the sidewalls of the trench, producing an electrode insulated from the monocrystalline semiconductor layer on the at least one sidewall of the trench and the semiconductor substrate.

17 Claims, 18 Drawing Sheets

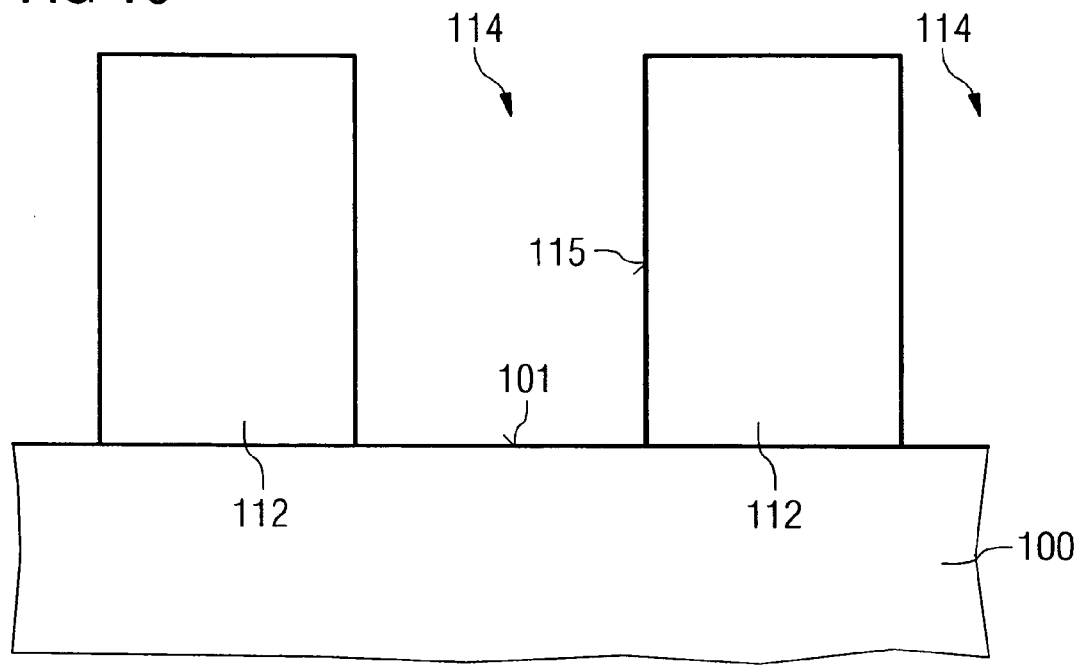
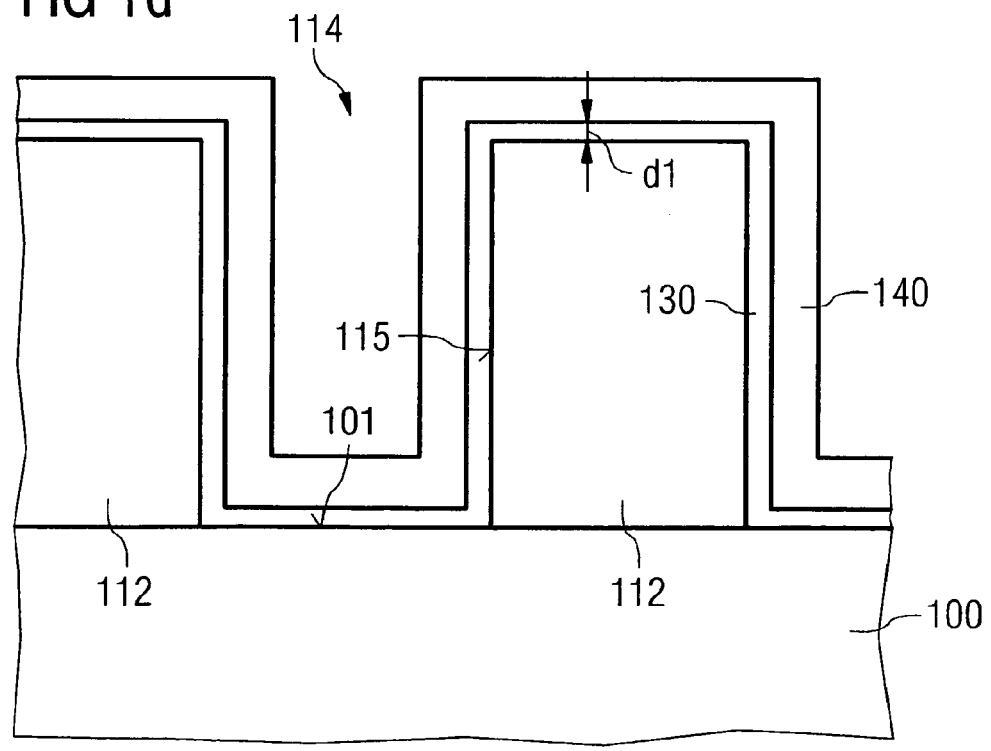

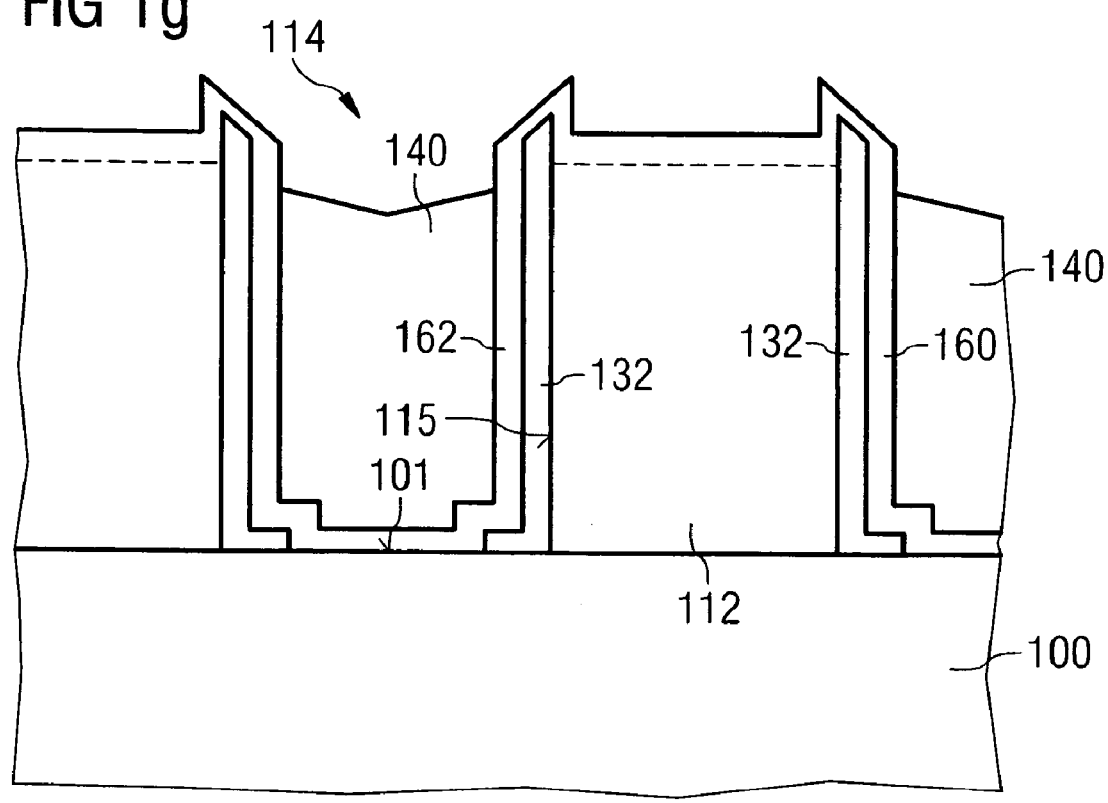
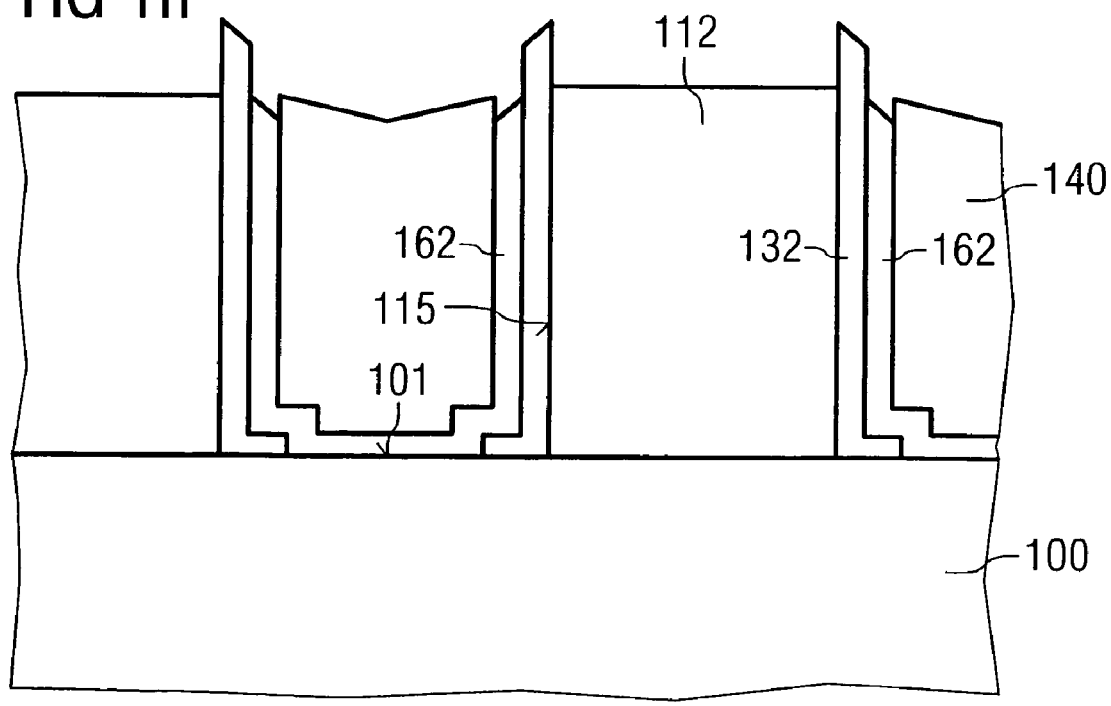

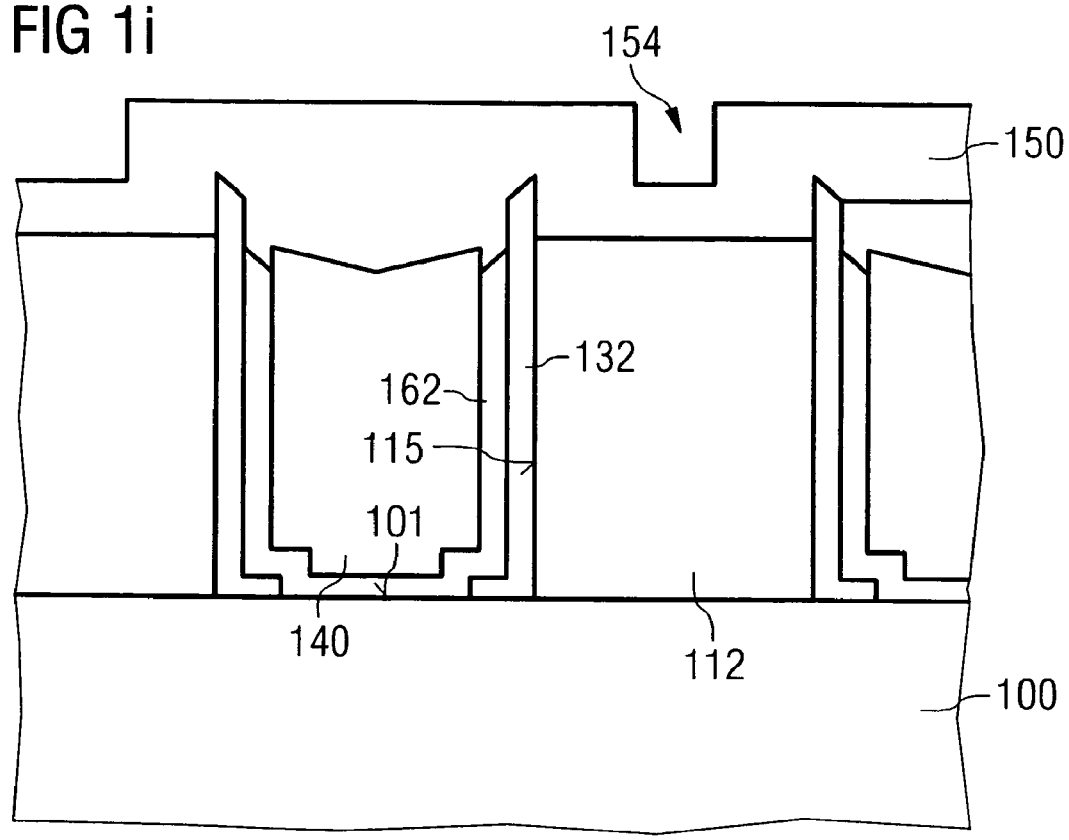
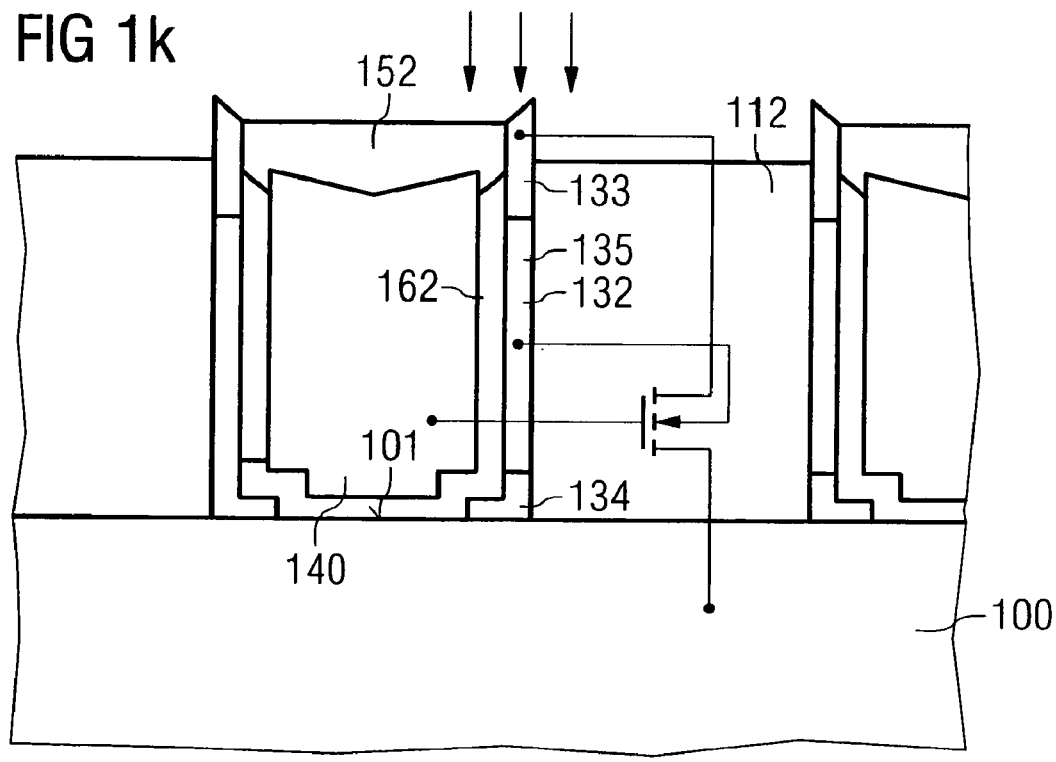

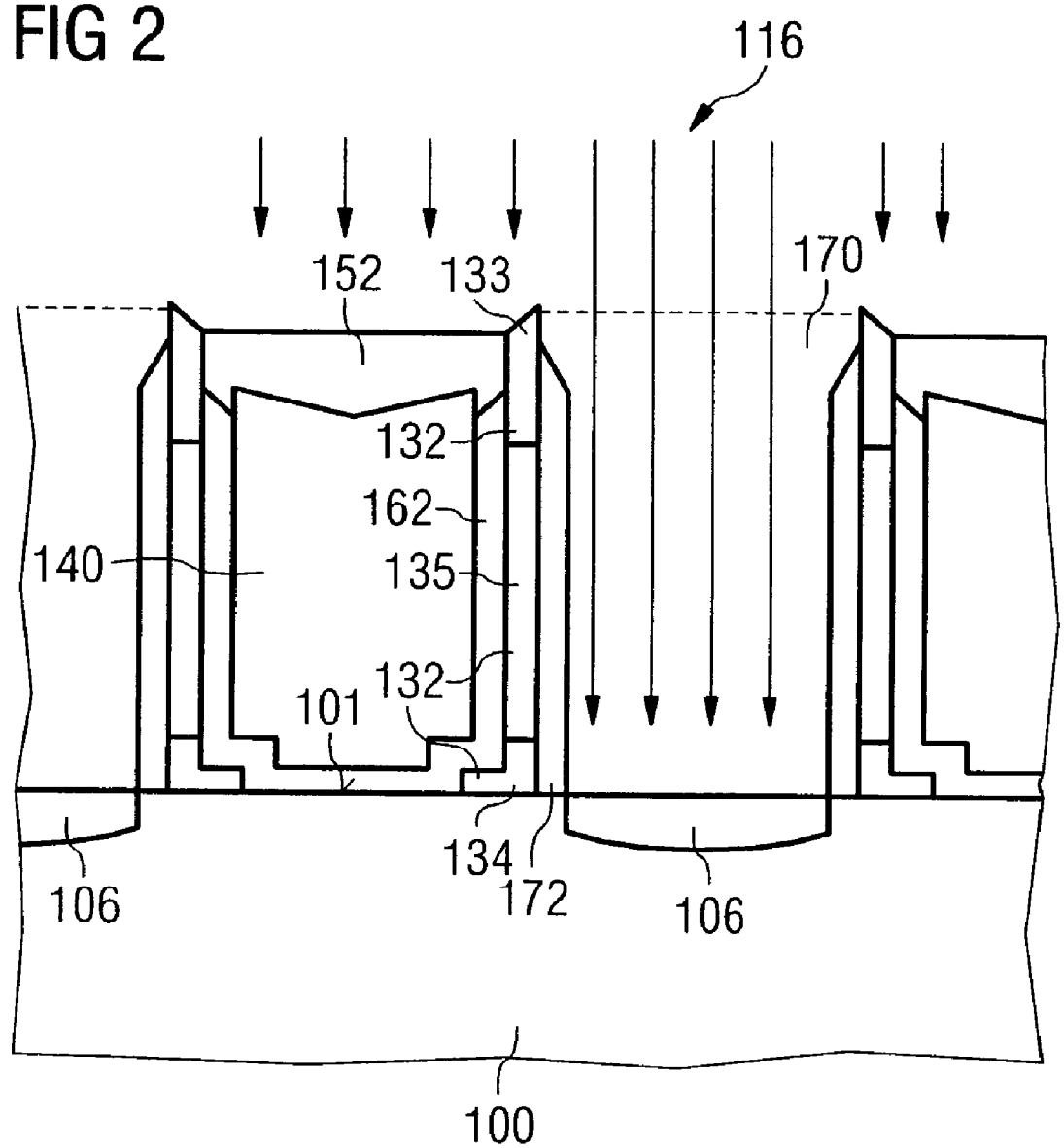

VERTICAL TRANSISTOR COMPONENT

CROSS-REFERENCE TO RELATED APPLICATIONS

This application is a divisional of, and claims the benefit of prior application Ser. No. 11/241,867, filed on Sep. 30, 2005, which claims the benefit of German Application DE 10 2004 047 627, filed Sep. 30, 2004.

FIELD

The present disclosure relates to a method for producing a vertical transistor component, in particular a MOS transistor component.

BACKGROUND

Vertical MOS transistor are sufficiently known and described for example in Stengl/Tihanyi: "Leistungs-MOS-FET-Praxis", ["Power MOSFETs in practice"], Pflaum Verlag, Munich, 1994, pages 29 to 40. Given suitable driving, in the case of vertical components of this type, a current-carrying path runs between a drain zone and a source zone in a vertical direction perpendicular to a front side and a rear side of a semiconductor body/semiconductor chip in which the component is integrated. The driving is effected via a gate electrode, which is arranged in a manner insulated from the semiconductor body and adjacent to a body zone situated between source and drain.

In the case of so-called trench transistors, the gate electrode is arranged in a trench extending into the semiconductor body proceeding from one of the sides. In the case of these trench transistors, the source zone is usually situated in the region of the front side of the semiconductor body, proceeding from which the trench extends into the semiconductor body. The drain zone is usually situated in the region of the rear side remote from the front side, a drift zone doped more weakly than the drain zone usually being arranged between the drain zone and the body zone in the case of power transistors.

Vertical MOS transistors are used as power transistors in a wide variety of areas. One area of application is switching converters, in which power transistors driven in clocked fashion are used for regulating the power consumption of the switching converter, and thus for regulating the output voltage.

One crucial operating parameter of such MOS power transistors is the on resistance thereof (Ron), which denotes the electrical resistance between drain and source when the component is driven into the on state, and the gate-drain capacitance thereof ($C_{GD}$), which denotes the parasitic capacitance between the gate electrode and the drain zone or the drift zone—adjacent to the drain zone—of the component.

In the case of components of this type, a reduction of the on resistance can be achieved by providing so-called field plates that are at gate potential. In the case of trench transistors, by way of example, a field plate, which may be formed integrally with the gate electrode, is in this case arranged in the trench below the gate electrode and adjacent to the drift zone. Such a component is described for example in U.S. Pat. Nos. 4,941,026 or 5,973,360.

The provision of a field electrode that is at gate potential increases the gate-drain capacitance, so that U.S. Pat. No. 5,283,201 or US 2003/0073287 A1 proposes providing a field electrode which is separate from the gate electrode and is at a potential that differs from the gate potential, for example source potential.

SUMMARY

It would be advantageous to provide a method for producing a MOS transistor component using trench technology which has a reduced gate-drain capacitance.

It would be advantageous to produce the body zone of the transistor component in self-aligned fashion with respect to the trench in which the gate electrode is arranged.

One embodiment of the method provides for providing a semiconductor substrate, applying an auxiliary layer to this semiconductor substrate, and patterning the auxiliary layer in order to produce at least one trench which is formed in the auxiliary layer and which extends as far as the semiconductor substrate and which has opposite sidewalls.

In this case, the auxiliary layer is preferably composed of a material which can be etched selectively with respect to the semiconductor substrate. Suitable materials for the auxiliary layer are oxides, in particular oxides that can be deposited, such as, for example, TEOS (tetraethoxysilan), or thermal oxides.

The term semiconductor substrate is to be understood hereinafter to mean either a homogenously doped semiconductor body or an arrangement with a semiconductor body to which at least one further semiconductor layer has already been applied—for example by means of an epitaxy method.

A monocrystalline semiconductor layer is subsequently produced on at least one of the sidewalls of the trench of the auxiliary layer, said monocrystalline semiconductor layer forming in sections the later body zone of the component. Said monocrystalline semiconductor layer may be produced by depositing an initially amorphous semiconductor layer or a polycrystalline semiconductor layer and subsequently crystallizing said semiconductor layer. The amorphous semiconductor layer is crystallized for example by means of a heat treatment step, in which the semiconductor layer is heated to a predetermined temperature, e.g. approximately 590° C., for a predetermined time duration, e.g. 6 hours to 10 hours.

Furthermore, an electrode insulated from the monocrystalline semiconductor layer and the semiconductor substrate that is uncovered at the bottom of the trench is produced, which electrode forms the later gate electrode of the component.

In the case of the component produced by means of the method according to at least one embodiment of the invention, the body zone is arranged in the monocrystalline semiconductor layer that has been produced on the sidewall of the trench of the auxiliary layer. In this case, the doping of this monocrystalline semiconductor layer running in the vertical direction is chosen depending on the desired properties of the component.

In the case of a normally off MOSFET, said semiconductor layer is doped complementarily with respect to the semiconductor substrate and has, at an end remote from the substrate, a semiconductor zone of the same conduction type as the substrate, which semiconductor zone forms the source zone of the component. If appropriate, a semiconductor zone of the same conduction type as the substrate is likewise produced at that end of the monocrystalline semiconductor layer which faces the substrate, said semiconductor zone serving for connecting the body zone to the substrate, which forms the drift zone or the drain zone of the component.

In the case of a normally on MOSFET, in which the gate electrode serves to "pinch off" a conducting channel in the body zone, the body zone is of the same conduction type as the semiconductor substrate, a semiconductor zone doped more heavily than the body zone preferably being present at an end of the semiconductor layer which is remote from the substrate, said semiconductor zone forming the source zone of the component.

The doping of the monocrystalline semiconductor layer for the purpose of setting the component properties may be effected in a conventional manner by implantation of dopant atoms and subsequent activation of the dopant atoms by means of a heat treatment step. The amorphous semiconductor layer deposited for producing the monocrystalline semiconductor layer may be undoped or may already be doped in situ with dopant atoms of one conduction type. The production of the optionally required semiconductor zone of the same conduction type as the substrate at that end of the monocrystalline semiconductor layer which faces the substrate is effected for example by means of a heat treatment step, the temperature and duration of which are chosen such that dopant atoms diffuse from the substrate into the monocrystalline semiconductor layer.

In the case of the method according to at least one embodiment of the invention, the dimensions of the monocrystalline semiconductor layer in the vertical direction of the arrangement, which crucially determine the dimensions of the body zone of the component, and thus the channel length, can be set by way of the height of the auxiliary layer deposited at the beginning of the method.

The pillar-type section of the auxiliary layer which is arranged adjacent to the trench of the auxiliary layer and serves for producing the monocrystalline semiconductor layer is preferably removed after the production of the monocrystalline semiconductor layer. The resulting trench reaching as far as the substrate can be used for example to realize a diode serving as a so-called backward diode of the MOSFET. For this purpose, the substrate at the bottom of the trench resulting from the removal of the auxiliary layer is doped complementarily with respect to the remaining sections of the substrate, a connection electrode of said diode subsequently being produced in the trench. Said connection electrode may be produced in such a way that it simultaneously makes contact with the monocrystalline semiconductor layer in order to short-circuit the source zone and the body zone in a known manner in the case of a normally off MOSFET. Furthermore, the connection electrode may also be produced in such a way that it is separated from the monocrystalline semiconductor layer by a spacer layer.

In the case of a method in accordance with a further embodiment of the method according to at least one embodiment of the invention for producing a MOS transistor component using trench technology, provision is made for providing a semiconductor substrate, applying an auxiliary layer to the semiconductor substrate, and patterning said auxiliary layer in order to produce at least one trench extending as far as the semiconductor substrate.

A monocrystalline semiconductor zone is subsequently produced in this at least one trench of the auxiliary layer, which semiconductor zone forms in sections the later body zone of the component. Said monocrystalline semiconductor zone is produced for example by means of a selective epitaxy method in which the semiconductor zone grows on the substrate in monocrystalline fashion. Such a selective epitaxy method is described for example in Liu et al.: "A Novel 3-D BiCMOS Technology Using Selective Epitaxy Growth (SEG) and Lateral Solid Phase Epitaxial (LSPE)", Electron Device Letters IEEE, Vol. 23, 2002. In this case, the semiconductor zone produced by means of selective epitaxy may be doped in situ with dopant atoms of a desired conduction type as early as during production.

After the production of the monocrystalline semiconductor zone, the auxiliary layer is removed, thus resulting in each case in a trench between two adjacent monocrystalline semiconductor zones. An electrode insulated from the monocrystalline semiconductor zone and the semiconductor substrate is subsequently produced in said trench, which electrode forms the latter gate electrode of the component.

By means of this method, too, both normally off and normally on MOSFETs can be produced depending on the doping of the monocrystalline semiconductor zone.

BRIEF DESCRIPTION OF THE DRAWINGS

Embodiments of the present invention is explained in more detail below with reference to figures.

FIG. 2 illustrates a modification of the method according to FIG. 1.

In the figures, unless specified otherwise, identical reference symbols designate identical parts and component regions with the same meaning.

DETAILED DESCRIPTION

Figure 1A:
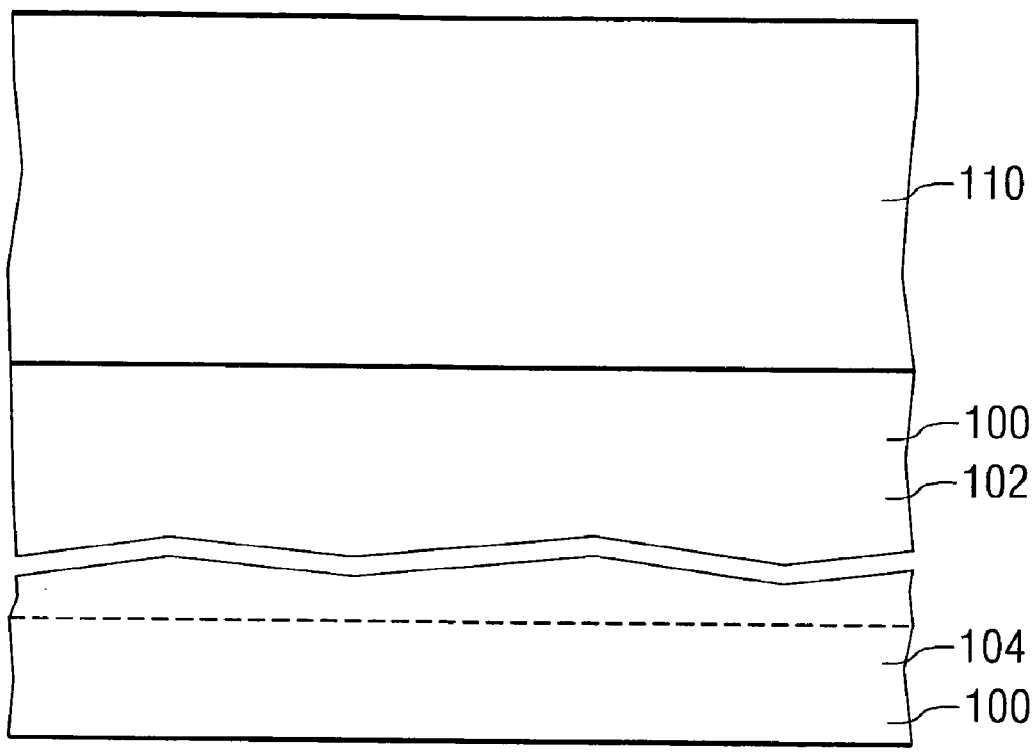
FIG. 1 illustrates a method according to at least one embodiment of the invention for producing a vertical MOS transistor component on the basis of representations of the component during different method steps.

A first method according to at least one embodiment of the invention for producing a MOS transistor component having a low gate-drain capacitance is explained below with reverence to FIG. 1.

The starting point of the method is formed by the provision of a semiconductor substrate 100. In this case, said semiconductor substrate 100 may be doped homogenously or may have differently doped sections 102, 104, which is represented by broken lines in FIG. 1a. In this case, a more heavily doped section 104 in the region of a rear side of the substrate may form the later drain zone of the component, while a more weakly doped semiconductor layer 102, which is produced for example by epitaxy on the more heavily doped semiconductor layer 104, may form the later drift zone of the component. If a drift zone—which serves for increasing the dielectric strength of the component—is not intended to be produced, the semiconductor substrate 100 is preferably heavily doped and forms the later drain zone of the component.

In the case of the method according to at least one embodiment of the invention, an auxiliary layer 110 is applied to the semiconductor substrate 100, which auxiliary layer can preferably be etched selectively with respect to the semiconductor substrate 100. Said auxiliary layer is composed for example of a deposited oxide, such as, for example, TEOS, or a grown thermal oxide.

Figure 1B:
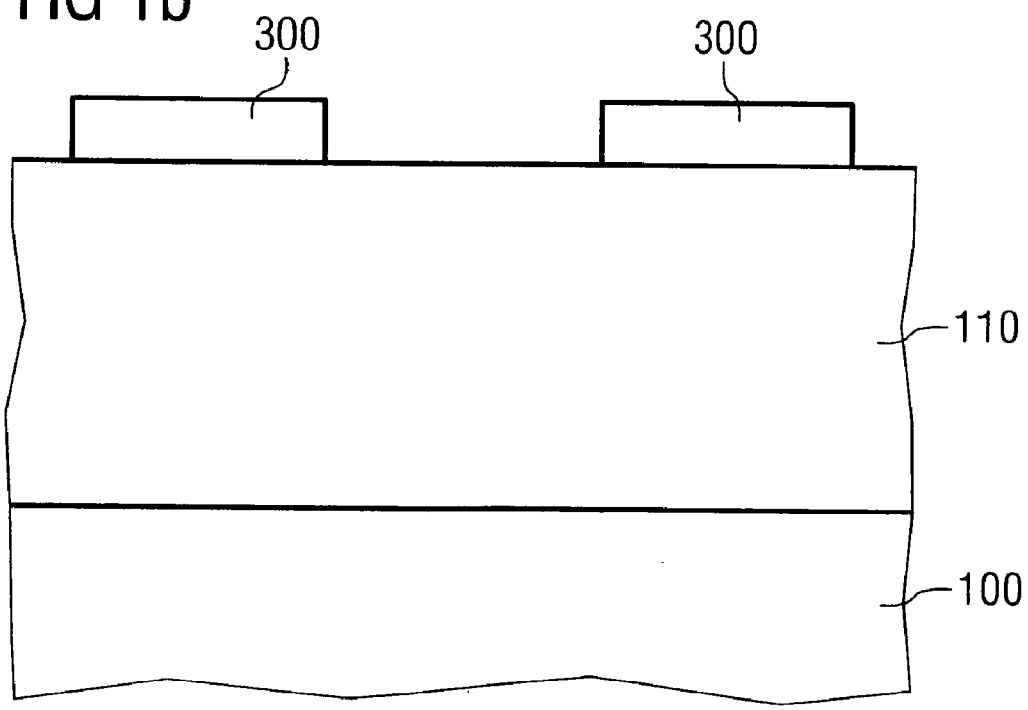

Said auxiliary layer 110 is subsequently patterned in order to produce at least one trench 114 reaching as far as the semiconductor substrate 100. Referring to FIG. 1b, for this purpose a patterned mask 300, for example a hard mask, is produced on the surface of the auxiliary layer 110, the structure of said mask prescribing the dimensions of the later trench in the lateral direction. The auxiliary layer 110 is subsequently removed in the regions left free by the mask 300 by means of an etching method in order to produce a trench 114 reaching as far as the semiconductor substrate 100.

FIG. 1c shows the arrangement after this etching step for producing the trench 114 and after the removal of the mask layer 300. The etching method for producing the trench 114 is preferably an anisotropic etching method by means of which the auxiliary layer 110 is etched essentially perpendicularly to that surface of the auxiliary layer 110 which is left free by the mask 300, and which results in the production of sidewalls 115 of the trench 114 which run essentially perpendicularly to the surface of the auxiliary layer 110 and perpendicularly to that surface 101 of the semiconductor substrate 100 which is uncovered after the etching. The reference symbol 112 in FIG. 1c designates pillar-type sections 112 of the auxiliary layer which are arranged between two adjacent trenches 114.

During further method steps, a monocrystalline semiconductor layer 130 is produced on the sidewalls 115 of the trench, which are simultaneously the sidewalls of the pillar-type sections 112 of the auxiliary layer, which monocrystalline semiconductor forms the later body zone of the MOS transistor. Referring to FIG. 1d, for this purpose an initially amorphous semiconductor layer 130, for example an amorphous silicon layer, may be deposited over the whole area onto the arrangement with the substrate 100 and the pillar-type sections 112 of the auxiliary layer. A thickness d1 of said amorphous semiconductor layer 130 is between 50 nm and 250 nm, preferably about 100 nm.

Said amorphous semiconductor layer 130 is subsequently crystallized by means of a heat treatment step, with the result that a monocrystalline semiconductor layer 130 arises. During said heat treatment step, the arrangement is heated to a crystallization temperature of the semiconductor material for a predetermined time duration. Said crystallization temperature is about 590° C. when amorphous silicon is used as the semiconductor material, and the duration of the heat treatment step is between 6 hours and 10 hours in the case of silicon. The heat treatment step is carried out in a sufficiently known manner for example in a furnace suitable for this purpose.

In order to obtain the monocrystalline semiconductor layer 130 only on the sidewalls 115 of the trench 114 or of the pillar-type auxiliary layer sections 112, the monocrystalline semiconductor layer 130 has to be removed from the bottom of the trench 114, that is to say from the surface 101 of the substrate 100, and from the top side of the pillar-type auxiliary layer sections 112. This can be done by means of an anisotropic etching method by means of which material of the monocrystalline layer 130 is removed only in the direction perpendicular to the surface 101 of the substrate 130.

Since it is usually not possible to completely avoid an etching of the monocrystalline semiconductor layer 130 applied to the sidewalls 115 of the trench 114 during such an etching method, a protective layer is preferably produced on those sections of the monocrystalline semiconductor layer 130 which are arranged on the sidewalls 115 of the trench 114. For this purpose, referring to FIG. 1d, firstly a protective layer 141, for example an oxide, is deposited over the whole area. Said protective layer 141 is subsequently removed by means of an anisotropic etching method in the bottom region of the trench 114 and from the top side of the pillar-type auxiliary layer sections 112 in order to uncover the monocrystalline semiconductor layer 130 in the bottom region of the trench and on the top side of the auxiliary layer pillars 112.

Said semiconductor layer 130 is subsequently removed in the uncovered regions by means of a further etching method. An etching of the substrate 100 at the bottom of the trench 114 is prevented by means of a so-called "end point monitoring", in which the gas composition of the gases that arise during the etching is monitored. Since the gas composition changes, the etching process can be stopped in a targeted manner as soon as the surface 101 of the substrate 100 is reached during the etching.

Figure 1E:
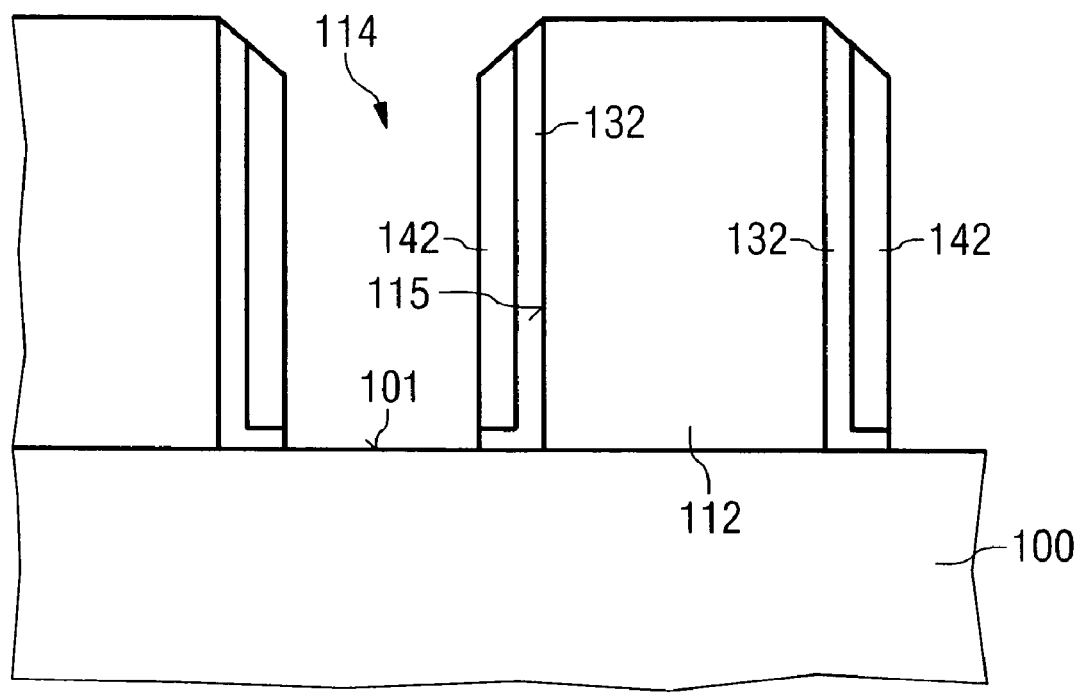

FIG. 1e shows the arrangement after these method steps have been carried out, that is to say after the removal of the protective layer 141 from the bottom of the trench 114 and from the top side of the pillars 112 and also after the removal of the crystalline semiconductor layer 130 in these regions. In FIG. 1e, those sections of the—after the heat treatment step—monocrystalline semiconductor layer 130/132 which have remained on the sidewalls 115 of the trench 114 are designated by the reference symbol 132 and the residual sections of the protective layer 140 are designated by the reference symbol 142.

Figure 1F:
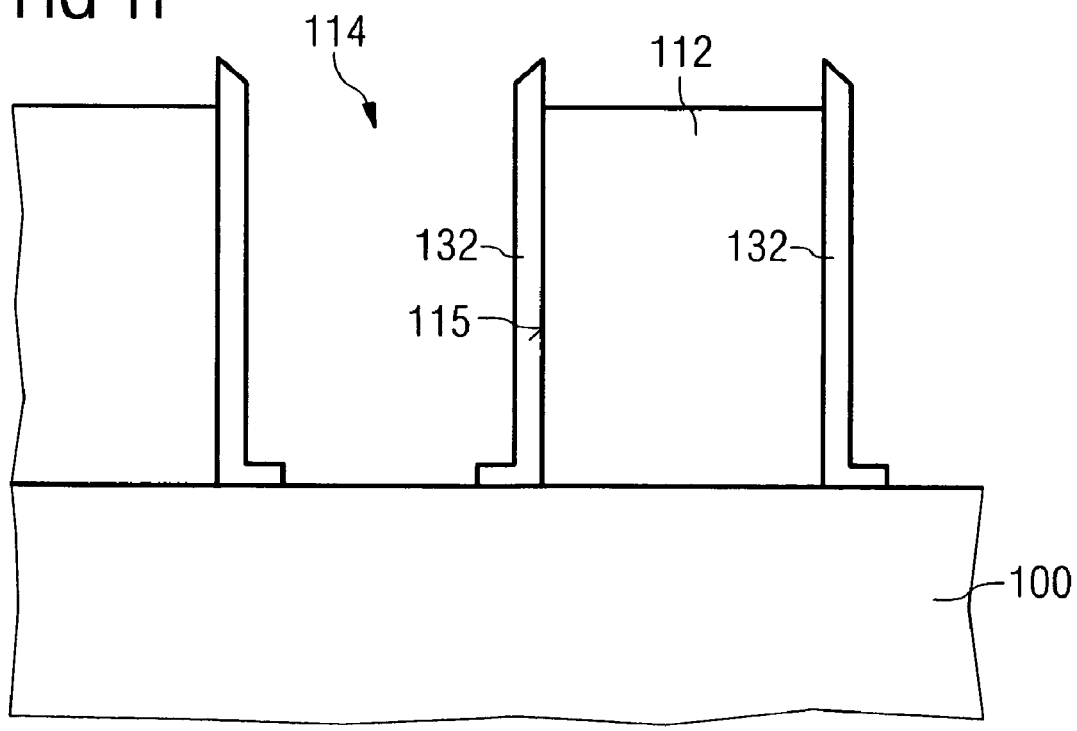

The residual sections 142 of the protective layer are subsequently removed, the result of which is represented in FIG. 1f. The protective layer 142 is removed for example by means of an etching method which etches the protective layer 142 selectively with respect to the semiconductor material of the substrate 100 and the semiconductor layer 132. In this case, the pillar-type section 112 of the auxiliary layer is preferably also etched back somewhat in the vertical direction, as a result of which the semiconductor layer 132 that extends essentially in the vertical direction projects upwardly above the surface of the auxiliary layer 112 somewhat. If both the protective layer 142 and the auxiliary layer 112 are composed of an oxide, the etching back of the auxiliary layer 112 and the removal of the protective layer 142 may be effected in a common method step. Otherwise, two separate method steps are required for removing the protective layer 142 and for etching back the auxiliary 112.

As already explained, the monocrystalline semiconductor layer 132 forms the later body zone of the MOS transistor. A gate electrode is required for controlling a conducting channel, said gate electrode being arranged in a manner insulated from the body zone and the remaining semiconductor regions of the component and adjacent to the body zone. One possible method for producing said gate electrode in the trench 114 is explained below with reference to FIGS. 1g and 1h.

Firstly, an insulation layer 160, for example an oxide, is produced on the uncovered semiconductor regions in the trench 114, that is to say on the monocrystalline semiconductor layer 132 on the trench sidewalls and on the semiconductor substrate 100 at the bottom of the trench, sections 162 of said insulation layer which are arranged on the monocrystalline semiconductor layer 132 forming the actual gate insulation or the actual gate oxide. The insulation layer 160 is composed of a thermal oxide, for example, which is produced by means of a heat treatment step in which the arrangement is heated to an oxidation temperature for a predetermined time duration. In this case, at the bottom of the trench 114, a thicker insulation layer is preferably produced on the semiconductor substrate 100 than on the monocrystalline semiconductor layer 132 on the trench sidewalls. This thick insulation layer is produced for example by implantation of argon ions into the semiconductor substrate 100 before the oxidation step is carried out.

Assuming that the auxiliary layer 112 is composed of an oxide, the oxide layer grows both on the semiconductor regions and on the auxiliary layer 112 during the oxidation step. The broken line in FIG. 1g schematically shows the upper edge of the auxiliary layer 112 before the oxidation step is carried out.

After production of the oxide layer 160, the gate electrode 140 is produced. For this purpose, by way of example, a layer made of electrode material is deposited onto the arrangement in order, in particular, to fill the trenches 114 with electrode material. The electrode material, for example highly doped polysilicon, is subsequently etched back in order to obtain gate electrodes 140 arranged in the trenches 114, the result of which is represented in FIG. 1g.

In this case, the gate electrode 140 has been produced in such a way that its top side remote from the substrate 100 ends below that end of the semiconductor layer 132 which is remote from the substrate 100, that is to say that the semiconductor layer 132 projects upward beyond the gate electrode 140.

Finally, the insulation layer 160 is partly removed from the semiconductor layer 132, so that the remaining sections of the insulating layer 160 are arranged exclusively between the gate electrode 140 and the semiconductor layer 132 and between the gate electrode 140 and the semiconductor substrate 100. In this case, the insulation layer 160 is preferably etched back somewhat between the gate electrode 140 and the semiconductor layer 132, so that the upper edge of the insulation layer 162 lies below the upper edge of the crystalline semiconductor layer 132. The arrangement after carrying out these method steps for partly removing the insulation layer is represented in FIG. 1h.

Referring to FIG. 1i, a further protective layer 150, for example formed from nitride, is deposited onto the arrangement, which serves as a protective layer for the gate electrode 140 during further method steps of the method according to at least one embodiment of the invention. The thickness of this deposited protective layer 150 is preferably greater than half the distance between opposite monocrystalline semiconductor layers 132 on opposite sidewalls 115 of the trench 114. Since the semiconductor layer 132, on the side areas of which the protective layer 150 is likewise deposited uniformly, protects upward beyond the gate electrode 140, this results in a thickness of the protective layer 150 above the gate electrode 140 which is more than twice as large as the thickness of the protective layer on a planar area having no elevation. In this context, it should be pointed out that the width of the trench 114 is less than the width of the pillar-type section 112 of the auxiliary layer remaining between two trenches, which results in a thinner section 154 of the protective layer 150 above the pillar-type auxiliary layer section 112 than above the gate electrode 140. The protective layer 150 is subsequently etched back isotropically, as a result of which the protective layer 150 is completely removed above the pillar-type sections 112 of the auxiliary layer, and as a result of which a region 152 of the protective layer remains above the gate electrode 140, the result of which is represented in FIG. 1k.

The component structure illustrated in FIG. 1k is suitable both for realizing normally off MOSFETs and for realizing normally on MOSFETs. In this case, the further method steps for producing the component are initially explained for the production of a normally off MOSFET having a body zone doped complementarily with respect to its source zone and drain zone.

As has already been explained, the semiconductor substrate 100 forms a part of the drain zone or of the drift zone of the component. As can be seen in FIG. 1k, the gate electrode 140 is arranged in a manner spaced apart from the semiconductor substrate 100 in the vertical direction of the component. Given suitable driving of the gate electrode 140, an enhancement zone can form in the monocrystalline semiconductor layer 132 essentially in the region which extends in the vertical direction along the gate electrode 140. Such an enhancement zone can form given suitable driving of the gate electrode only to a small extent in a section 134 of the semiconductor layer 132 which lies in the vertical direction between the lower edge of the gate electrode 140 and the semiconductor substrate 100. Therefore, this section 134 of the semiconductor layer 132 between the substrate 100 and the lower edge of the gate electrode 140 is advantageously doped with dopant atoms of the same conductivity type as the semiconductor substrate 100. In order to produce this semiconductor zone 134, a heat treatment step is preferably carried out, during which the arrangement is heated to a suitable diffusion temperature for a predetermined duration, as a result of which dopant atoms diffuse from the semiconductor substrate 100 upward into the semiconductor layer 132.

In the case of a normally off MOSFET, a section 135 of the semiconductor layer 132 which lies adjacent to the gate electrode 140 in the lateral direction is doped complementarily with respect to the semiconductor substrate 100 and forms the actual body zone of the component, in which an enhancement zone forms given suitable driving of the gate electrode 140. In order to produce this complementarily doped semiconductor zone 135, there is the possibility of already doping the deposited amorphous semiconductor layer 130 (cf. FIG. 1d) in situ with dopant atoms that are complementary to the semiconductor substrate 100. In order to produce a p-doped semiconductor layer 132, the latter may for example be doped in situ with boron atoms.

Furthermore, there is the possibility of producing the semiconductor zone 135 after production of the protective layer 152 on the gate electrode 140 by means of an implantation method. In this case, dopant atoms are implanted from above into the semiconductor layer 132 and subsequently activated by means of a heat treatment step.

The semiconductor zone 135 forming the body zone is preferably produced in such a way that it has a gradient of the doping concentration in such a way that the doping concentration increases in the lateral direction proceeding from the insulation layer 162.

The production of a, preferably highly doped, further semiconductor zone 133 of the same conduction type as the substrate 100, which forms the source zone of the component, is preferably likewise effected by means of an implantation method in which dopant atoms are implanted from above into the semiconductor layer 132 and subsequently activated by means of a heat treatment step. The penetration depth of the dopant atoms during implantation methods can be set by way of the implantation energy in a sufficiently known manner, the implantation energy for producing the body zone 135 situated deeper being higher than the implantation energy of the source zone 133 situated further up. The source zone 133 is preferably produced in such a way that it overlaps the gate oxide 162, in order to ensure that when the gate electrode 140 is driven in conducting fashion, an enhancement zone arises in the semiconductor layer 132 between the source zone 133 and the semiconductor zone 134, which forms a part of the drift zone or drain zone.

In the case of a normally on MOSFET, the semiconductor layer 132 is of the same conduction type as the substrate 100, a more highly doped source zone 133 of the same conduction type preferably being produced. The connecting zone 134 can be dispensed with in this case.

The doping of the semiconductor layer 132 with dopant atoms of the same conduction type as the substrate 100 may already be effected, in the manner explained, during deposition of the amorphous semiconductor layer, which may be doped in situ with dopant atoms.

In order to afford a better understanding, FIG. 1*k* represents the electrical equivalent circuit diagram of the normally off MOS transistor present after the method steps that have been explained up to this point.

In the case of the component, body zone 135 and source zone 133 have not yet been short-circuited by this point, so that the component is in the off state upon application of a voltage in the reverse direction (source-drain direction).

The source zone 133 and the body zone 135 are preferably short-circuited in a known manner. The further method steps for producing a MOS transistor in which the source and body zones are short-circuited are explained below with reference to FIGS. 1*l* and 1*m*.

Figure 1L:
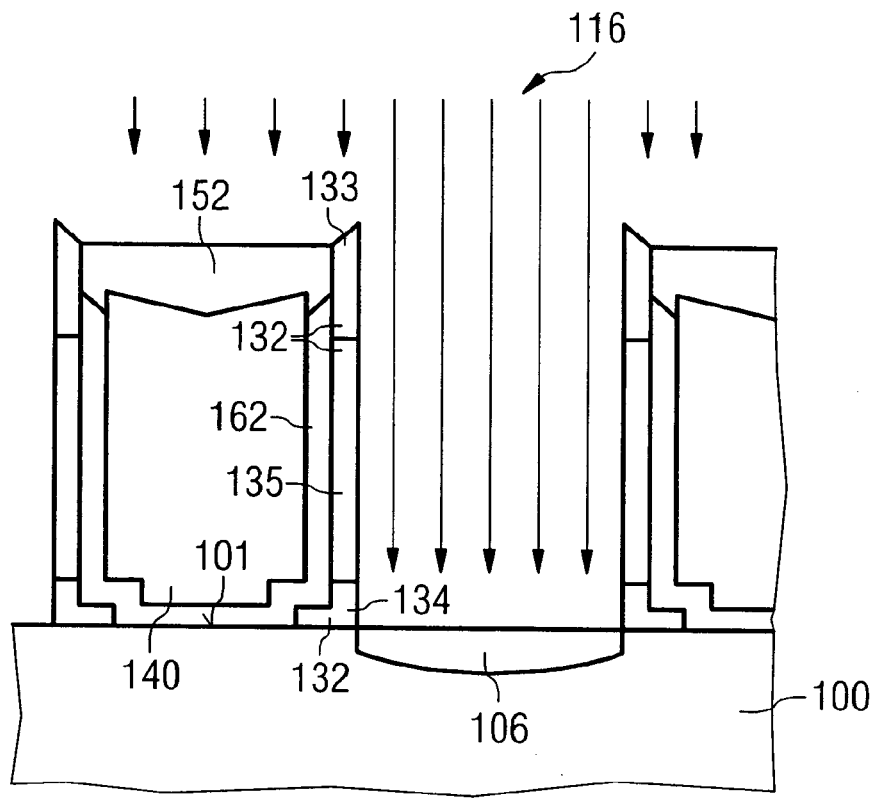
Figure 1M:
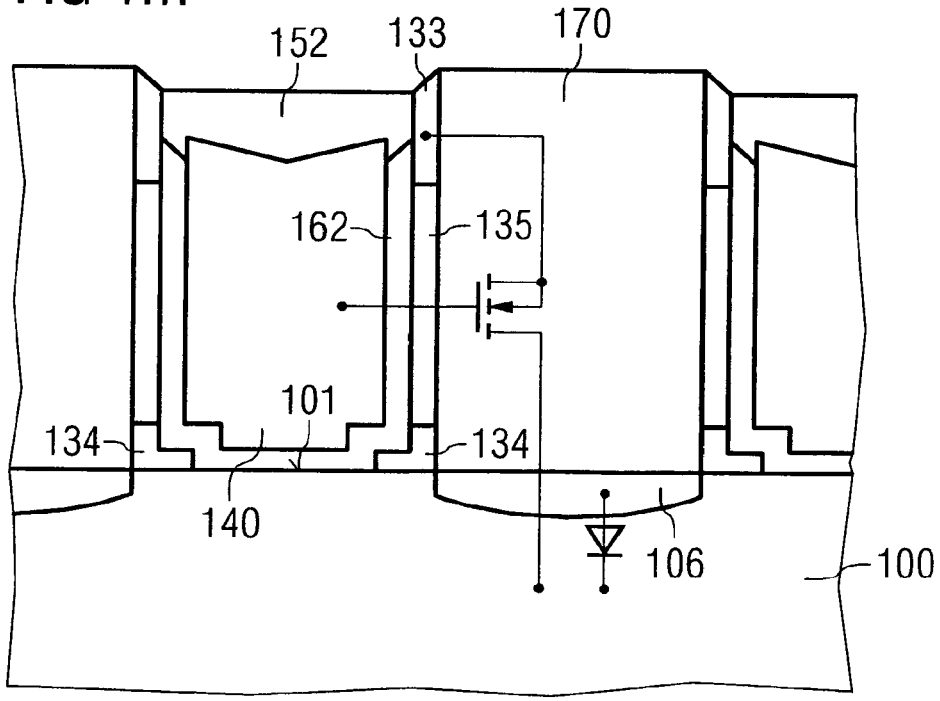

Referring to FIG. 1*l*, firstly the pillar-type sections 112 of the auxiliary layer are removed. For this purpose, by way of example, an etching method is carried out which etches the pillar-type sections 112 of the auxiliary layer selectively with respect to the semiconductor material. This results in a trench 116 between crystalline semiconductor layers 132 that are arranged in a manner spaced apart from one another and extend in the vertical direction of the arrangement. At the bottom of this trench, dopant atoms of the complementary conduction type with respect to the semiconductor substrate 100 are subsequently implanted into the semiconductor substrate 100 and the trench 116 is subsequently filled with an electrically conductive material, for example doped polysilicon. This results in an electrode 170, which makes contact with firstly the body zone 135 of the MOS transistor and secondly the semiconductor zone 106 resulting from the implantation, said semiconductor zone being doped complementarily with respect to the remaining sections of the semiconductor substrate 100. Said semiconductor zone 106 forms a pn junction together with the remaining regions of the semiconductor substrate 100, and thus a diode that is contact-connected by means of the connection electrode 170. In order to afford a better understanding, the circuit symbols of the MOSFET and of the diode are likewise represented in the semiconductor arrangement represented in FIG. 1*m*, it being assumed that the semiconductor substrate 100 is n-doped, and that the semiconductor zone 106 and the body zone 135 are correspondingly p-doped.

The doping type of the connection electrode 170 is chosen such that it corresponds to the doping type of the body zone 135. The electrode 170 is thus doped complementarily with respect to the source zone 133 and complementarily with respect to the semiconductor zone 134, which forms a part of the drift zone. This prevents the electrode 170 in the trench from short-circuiting the source zone 133 and the drift zone section 134 whilst bypassing the body zone 135.

Figure 1N:
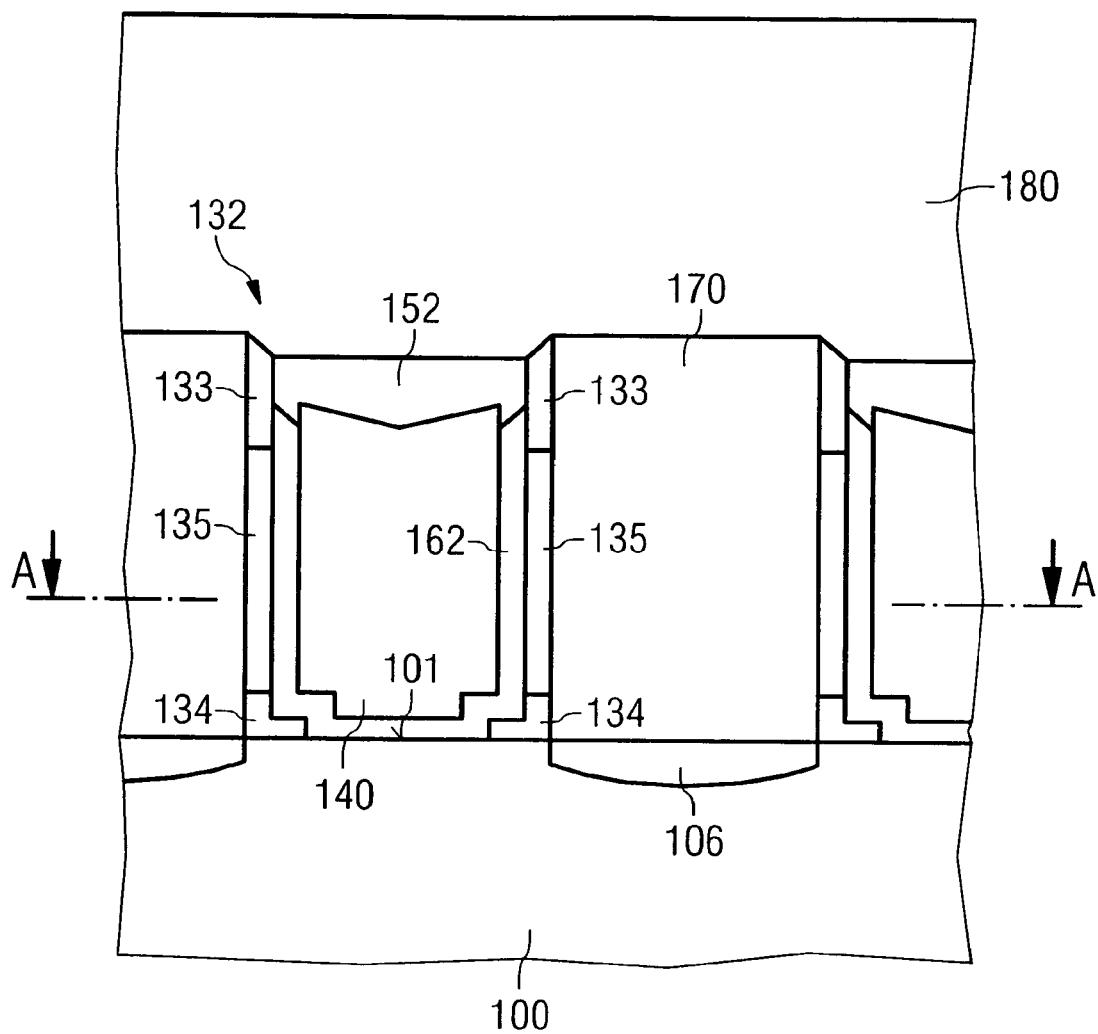

Referring to FIG. 1*n*, a contact layer 180, for example a metal layer, is finally deposited onto the arrangement, which makes contact with the source zones 133 of the individual transistor cells and the electrodes 170 and connects them to one another. Via said contact layer 180, a short circuit is formed between the source zone 113 and the body zone 135 contact-connected by the connection electrode 170. In this case, a respective transistor cell comprises one of the monocrystalline semiconductor layers 132 extending in the vertical direction proceeding from the semiconductor substrate 100. The contact layer 180 and also the semiconductor substrate 100, which forms the drain zone or drain zone and drift zone, is common to all the transistor cells.

FIG. 2 illustrates a modification of the method explained above with reference to FIG. 1. In the case of this method, after removal of the pillar-type sections 112 of the auxiliary layer (in this respect, see reference symbol 112 in FIG. 1*k*) and before production of the connection electrode, a spacer layer 172 is applied to the monocrystalline semiconductor layer 132 in the region of the trench 116, which, after production of the connection electrode, which is already represented by broken lines in FIG. 2, prevents said connection electrode 170 from short-circuiting the source zone 133 and the body zone 135 of the MOS transistor. The spacer 172, which is preferably produced before the actual implantation of the dopant atoms for the production of the semiconductor zone 106, furthermore limits the extent of said semiconductor zone 106 in the lateral direction of the arrangement. In order that the semiconductor zone 106 does not in this case extend in the lateral direction to below the monocrystalline semiconductor layer 132, the activation step required for activating the semiconductor zone 106 is employed with a correspondingly short duration.

In the example represented in FIG. 2, the spacer layer covers the body zone 135 and the drift zone section 134 in the trench completely and the source zone 133 in sections. In a manner that is not represented in any specific detail, there is also the possibility in this case of producing the spacer layer 172 such that it leaves free the source zone 133 in the trench and leaves free the body zone 135 at least in sections, but completely covers the drift zone section 134. In this case, the connection electrode 170 makes contact with the source zone 133 and the body zone in the trench, but is insulated from the drift zone section 134. The electrode 170 is preferably composed of a degenerate, that is to say an extremely highly doped, semiconductor material or of a metal.

The spacer layer 172, which is composed for example of a dielectric, such as an oxide, for example, may be produced by a procedure in which a layer (not represented) suitable for producing the spacer layer is initially produced over the whole area on the sidewalls and the bottom of the trench 116, and this layer is subsequently etched anisotropically in order to remove it from the bottom of the trench. During such an anisotropic etching method, the layer is also removed from above on the sidewalls of the trench. The height of the spacer layer 172 present at the end of the etching step, relative to the bottom of the trench, is all the smaller in this case, the longer etching is effected. In order to obtain a spacer layer 172 which essentially only covers the drift zone section, the duration of the etching method is to be set longer than when producing a spacer layer which also completely covers the body zone 135.

The trenches 114 produced in the auxiliary layer 110 at the beginning of the method run in a direction perpendicular to the plane of the drawing preferably in elongated fashion, which results in a transistor component having so-called strip cells, that is to say transistor cells in which the gate electrodes 140 run in strip form in elongated fashion in the trenches 114.

Figure 3A:
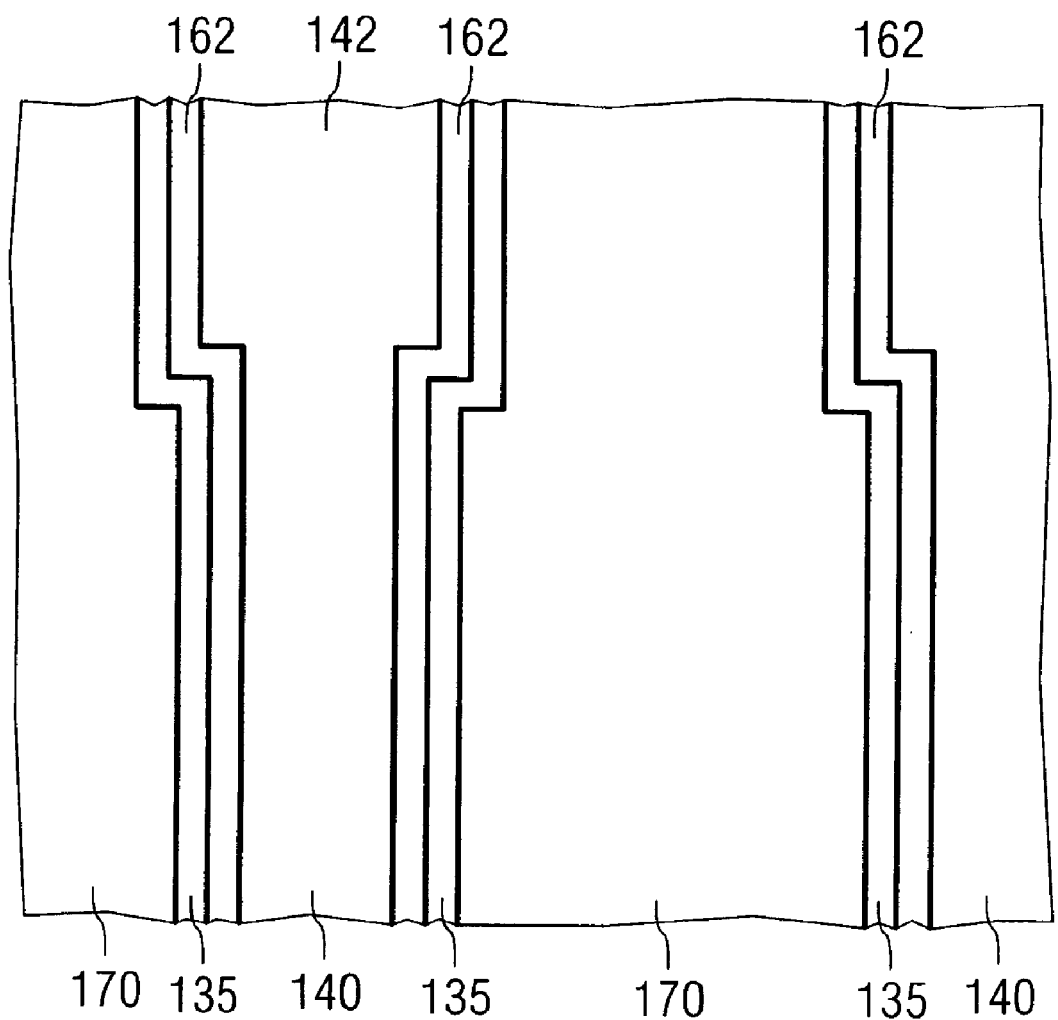
FIG. 3 illustrates the procedure for making contact with the gate electrode in the case of a component produced according to the method in accordance with FIG. 1 or 2.

FIG. 3*a* shows a cross-sectional representation of the component in accordance with FIG. 1*n* in a sectional plane A-A, which clearly reveals the strip-type course of the individual transistor cells.

Preferably, the trenches 114 are produced in the auxiliary layer 110 in such a way that the trenches run in widened fashion in sections compared with the remaining sections. This results in a gate electrode 140 which is widened locally compared with the remaining sections of the gate electrode in the lateral direction. In this widened section 142, the gate electrode can be contact-connected from above, as will be explained below with reference to FIGS. 3*b* and 3*c*.

Figure 3B:
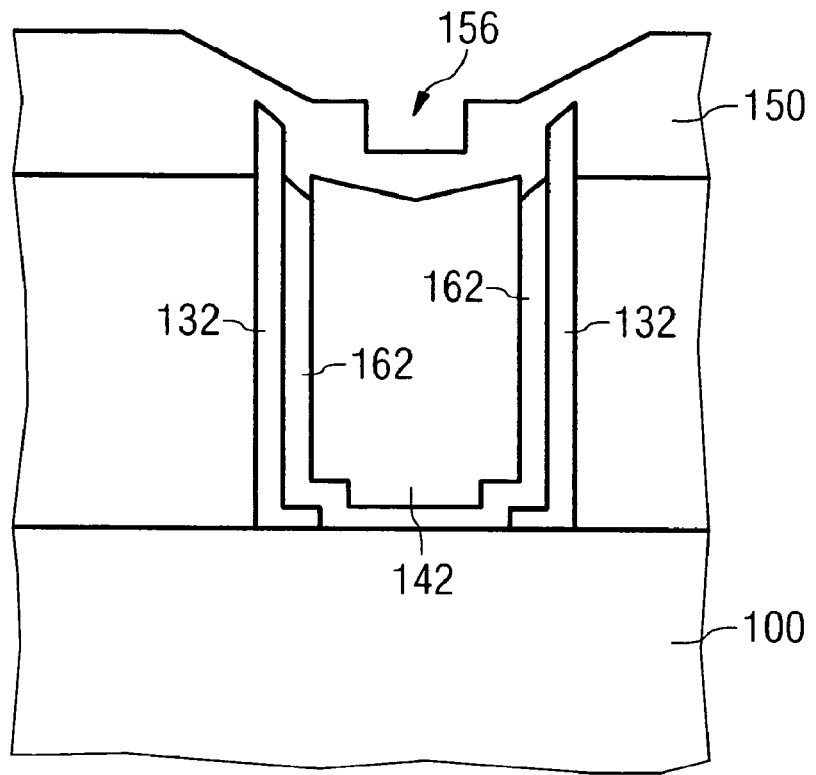
Figure 3C:
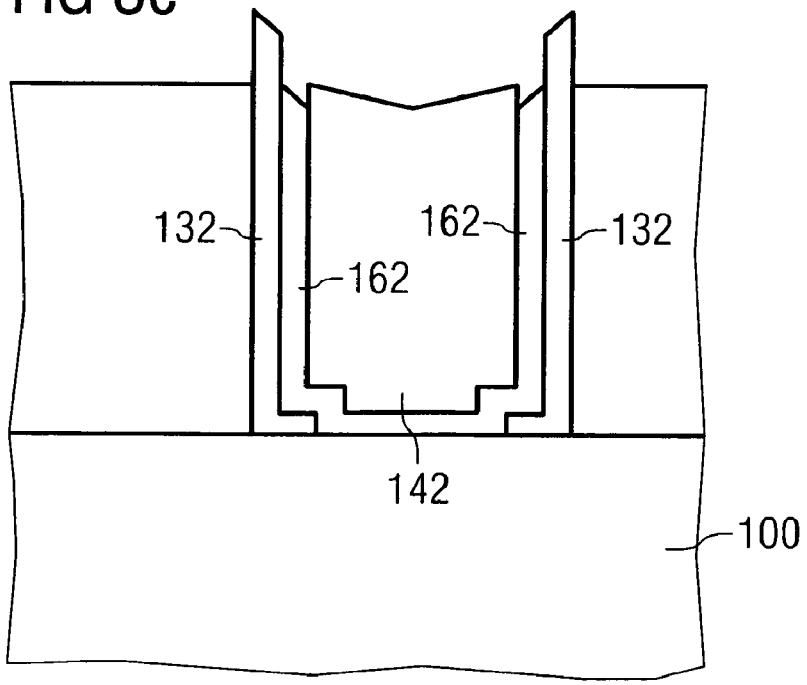

FIG. 3*b* shows a cross section through the widened section 142 of the gate electrode after deposition of the protective layer 150. Owing to the larger width of the trench and of the gate electrode 140 in this section 142, the protective layer 150 has a region 156 having a smaller thickness than above narrow sections of the gate electrode 140. This thinner region 156 has the effect that, during the subsequent etching step, the protective layer 150 is removed above the widened region 142 of the gate electrode 140, the result of which is represented in FIG. 3c. The gate electrode can be contact-connected from above in this region, or can be short-circuited with the other gate electrodes of the component by means of a suitable connecting layer. By virtue of the protective layer 150 being removed at least in sections above the widened region 142 of the gate electrode 140, the contact-connection of the gate electrodes is effected in self-aligning fashion. The width of the trench or of the gate electrode 140 in the region 142 of the gate electrode is preferably more than twice the thickness of the protective layer 150, since this promotes the formation of the trench 156.

A further embodiment of the method according to at least one embodiment of the invention for producing a MOS transistor having a reduced gate-drain capacitance is explained below with reference to FIG. 4.

Figure 4A:
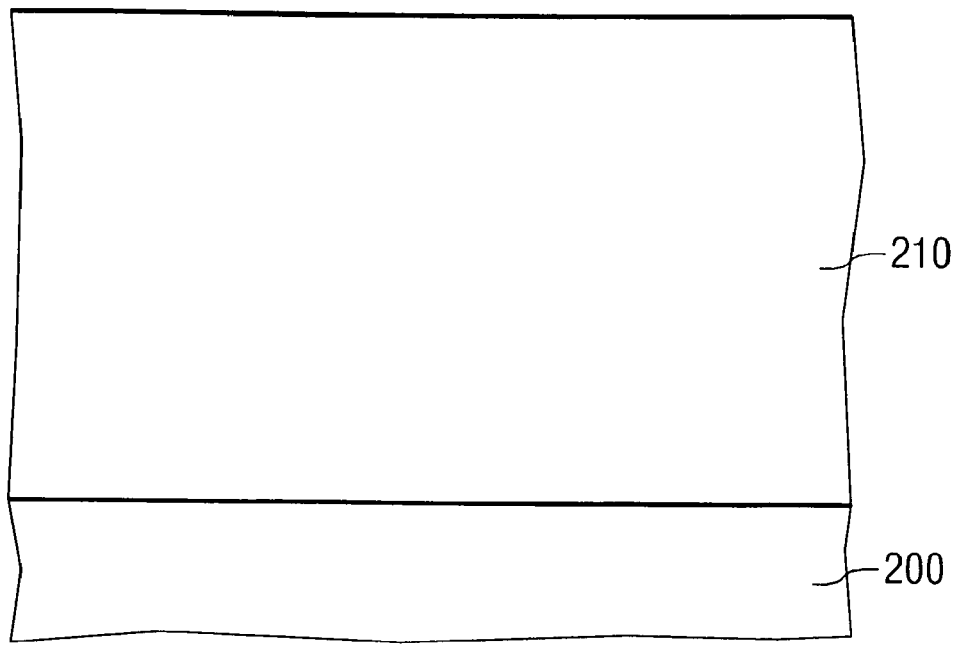
FIG. 4 illustrates a further method according to at least one embodiment of the invention for producing a vertical MOS transistor component on the basis of representations of the component during different method steps.

The starting point of the method is formed by the provision of a semiconductor substrate 200, which, in accordance with the semiconductor substrate 100 explained above, may either be homogenously doped or, if appropriate, comprise a plurality of differently doped semiconductor layers or zones. An auxiliary 210 is applied to this semiconductor substrate 200, the result of which is represented in FIG. 4a. The auxiliary layer 210 can preferably be etched selectively with respect to the semiconductor substrate 200 and is composed for example of a thermally grown oxide or a deposited oxide, such as TEOS, for example. The thickness of said auxiliary layer 210 is between 1 μm and 5 μm, for example.

Said auxiliary layer 210 is subsequently patterned in order to produce trenches 213 which reach as far as the semiconductor substrate 200 in the vertical direction of the arrangement represented. These trenches 213 run in elongated fashion in a direction perpendicular to the plane of the drawing represented, that is to say are formed substantially longer than the trench width in this direction. After the patterning, pillar-type sections 211 remain between adjacent trenches 213 of the auxiliary layer 210, which sections are likewise formed such that they run in elongated fashion in a direction perpendicular to the plane of the drawing represented.

Figure 4B:
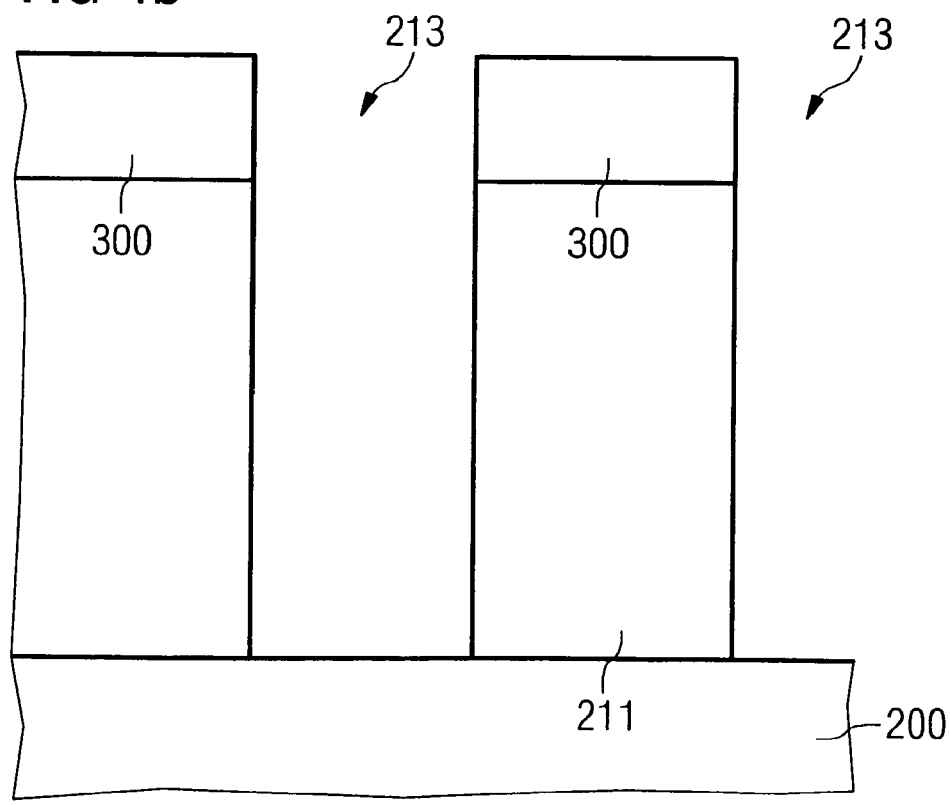

The result of the patterning of the auxiliary layer 210 for the purpose of producing the trenches 213 and the pillar-type sections 211 is represented in FIG. 4b, said patterning being effected in a manner already explained with reference to FIGS. 1b and 1c, for example using a patterned mask layer 300.

Figure 4C:
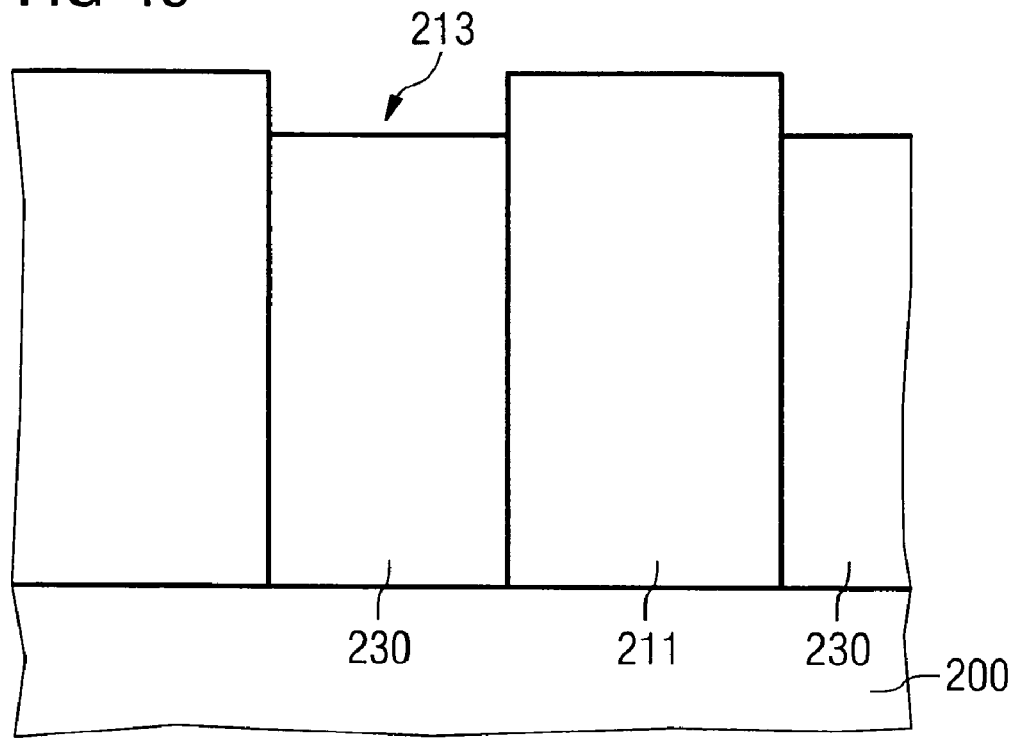

As is represented in FIG. 4c, a monocrystalline semiconductor zone 230 is subsequently produced on the semiconductor substrate 200 in the trenches 213 produced in the auxiliary layer 210. Said semiconductor zone 230 forms in sections the later body zone of the component. In order to produce a normally off MOS transistor, said semiconductor zone 230 is doped complementarily with respect to the semiconductor substrate 200, while it is of the same conduction type as the semiconductor substrate 200 for the purpose of producing abnormally on MOS transistor. The production of this monocrystalline semiconductor zone 230 on the semiconductor substrate 200 is effected for example by means of a selective epitaxy method.

Figure 4D:
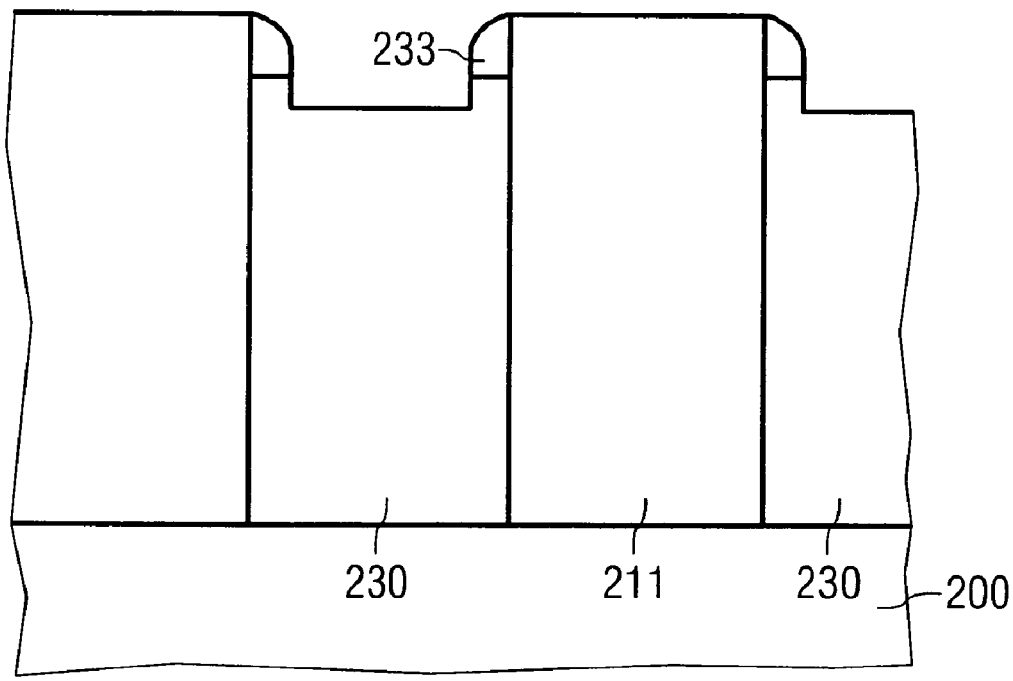

In next method steps, the result of which is represented in FIG. 4d, in order to produce the later source zone of the component, a highly doped semiconductor layer, for example highly doped polysilicon, is deposited and subsequently etched selectively, so that sections of said highly doped semiconductor layer remain on sidewalls of the pillar-type auxiliary layer sections 211 which project upwardly above the monocrystalline semiconductor layer 230. These highly doped zones are designated by the reference symbol 233 in FIG. 4d.

The etching of the previously deposited, highly doped semiconductor layer (not represented in any greater detail) for the production of said semiconductor zones 233 is preferably effected in such a way that the monocrystalline semiconductor zone 230 is etched back somewhat in regions in which the semiconductor zones 233 are not arranged.

Figure 4E:
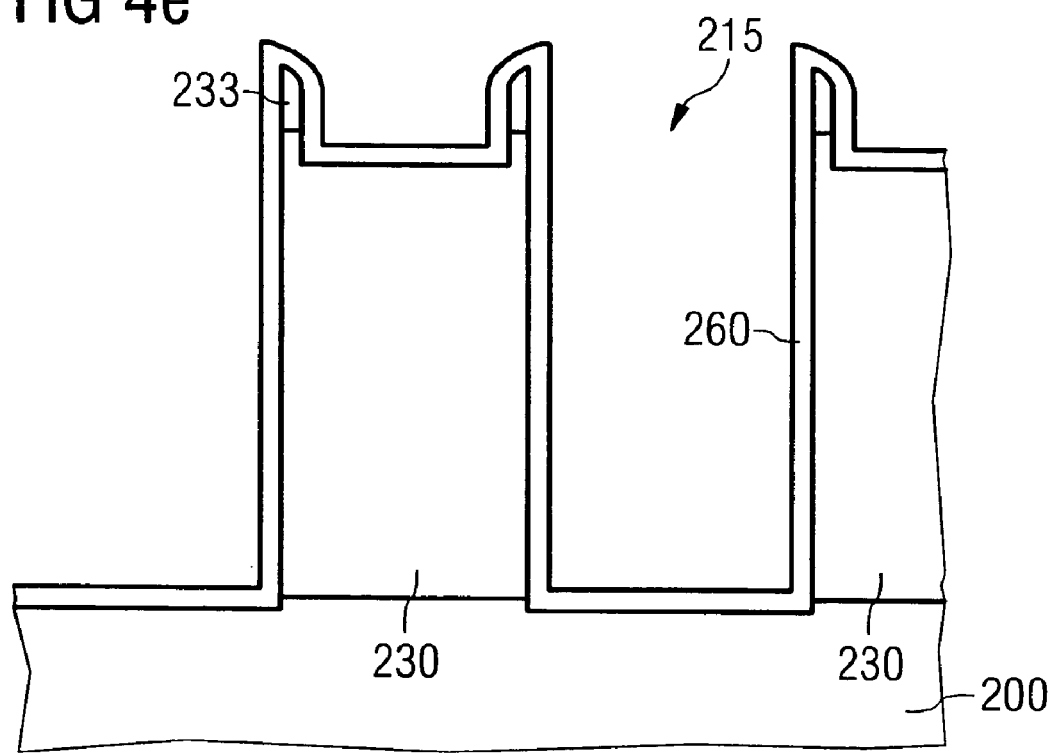

In next method steps, the result of which is represented in FIG. 4e, the pillar-type sections 211 of the auxiliary layer that remained after the first patterning are removed, thereby giving rise to trenches 215 being adjacent monocrystalline semiconductor zones 230. These sections 211 of the auxiliary layer are preferably removed by means of a wet-chemical etching method.

An insulation layer 260 is subsequently produced on those sections of the semiconductor zones which are uncovered after the removal of the pillar-type sections 211 of the auxiliary layer, that is to say on the semiconductor substrate 211 at the bottom of the trenches 215, on the sidewalls of the semiconductor zone 230 in the trenches and also on the highly doped semiconductor layer 230. Said insulation layer 260 forms in sections the later gate insulation of the component. Said insulation layer 260 is an oxide layer, for example, which is produced by heating the component to a predetermined oxidation temperature for a predetermined time duration, as a result of which uncovered regions of the semiconductor zones are oxidized.

An electrode material is subsequently introduced into the trenches between the pillar-type semiconductor zones 230, said electrode material forming the later gate electrode 240 of the component. Said electrode material is introduced for example by depositing an electrode layer on the arrangement and etching back the electrode layer until only the trenches 215 are filled with electrode material. The electrode material is a highly doped polysilicon, by way of example.

Figure 4F:
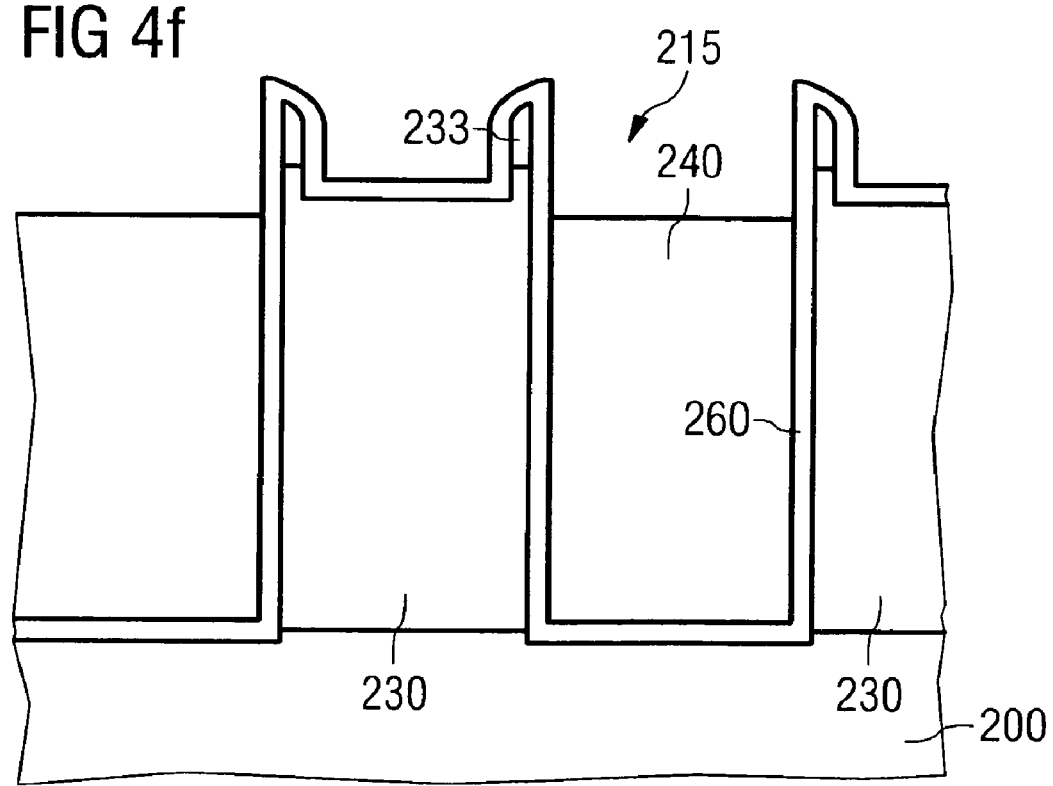

A cross section through the arrangement after production of the gate electrode 240 is represented in FIG. 4f.

Figure 4G:
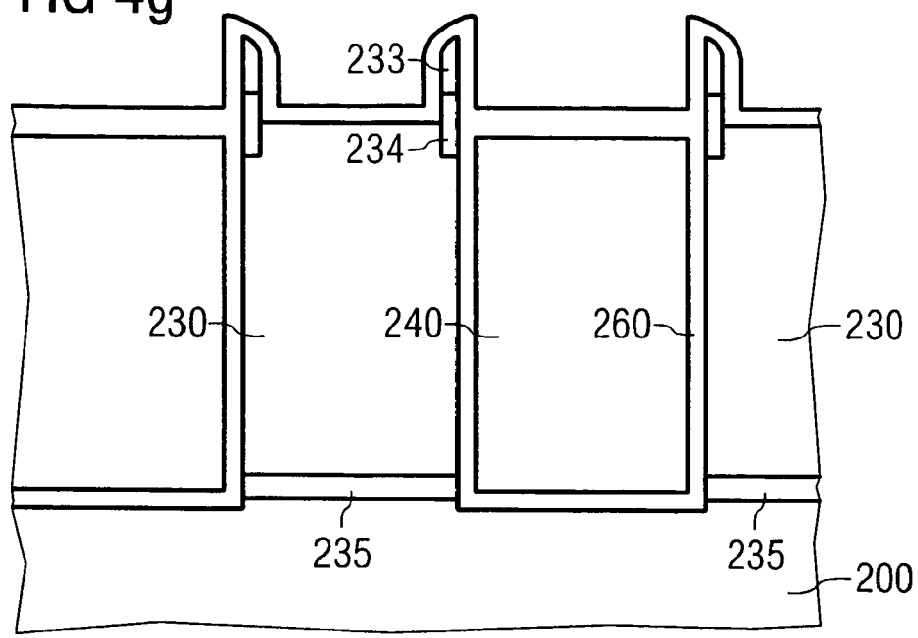

FIG. 4g shows the arrangement in cross section after further method steps have been carried out, in which method steps the arrangement is heated to an oxidation and diffusion temperature for a predetermined time duration. On account of this thermal step, dopant atoms diffuse from the highly doped semiconductor zones 233, which may be polycrystalline semiconductor zones, into the monocrystalline semiconductor zone 230 in order to form the actual source zones 234 of the component. Moreover, dopant atoms diffuse from the semiconductor substrate 200 upward into the monocrystalline semiconductor zone 230. The depth with which the dopant atoms indiffuse into the monocrystalline semiconductor zones 230 from below determines the so-called gate-drain overlap and thus the gate-drain capacitance of the component. Said gate-drain overlap can be set in particular by way of the duration of the thermal step and the doping concentration of the semiconductor substrate 200. Furthermore, an oxide layer arises in particular at the top side of the gate electrode 240, which oxide layer enlarges the insulation layer 260. Since the growth of such oxide layers is particularly pronounced above doped, in particular above heavily doped, semiconductor material, the section of the insulation layer 260 at the top side of the gate electrode 240 is preferably thicker than above the monocrystalline semiconductor zone 230 and above the highly doped zones 233.

Figure 4H:
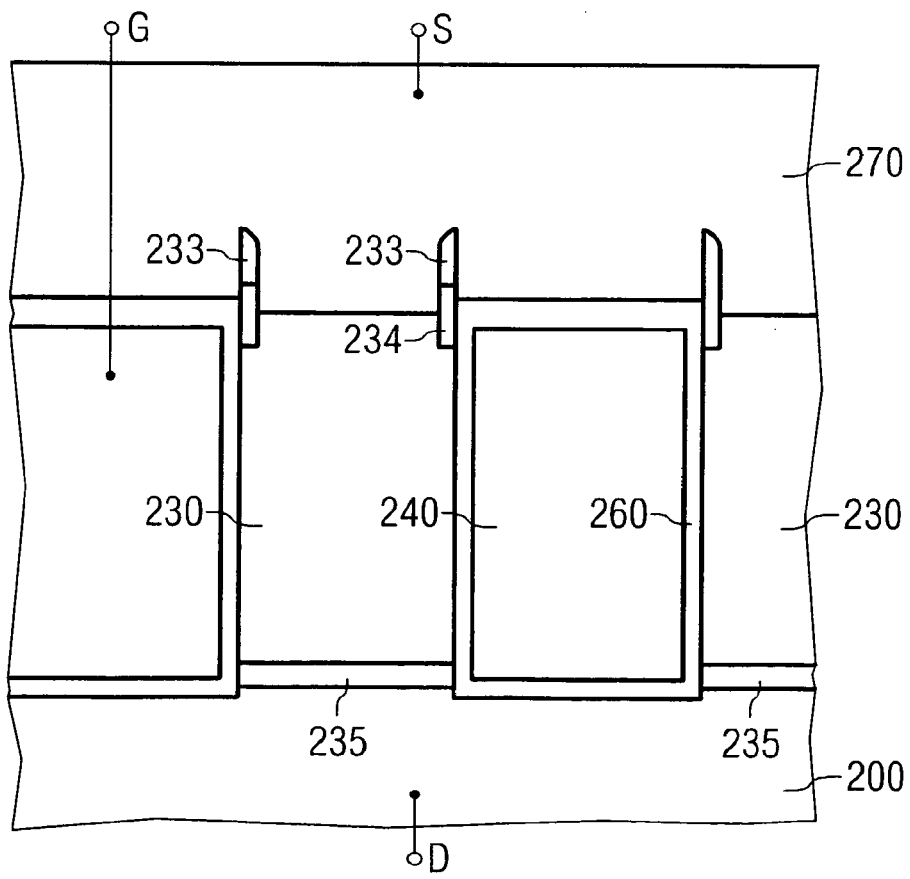

As illustrated in FIG. 4h, the insulation layer 260 is subsequently removed above the semiconductor zones, that is to say above the monocrystalline semiconductor zone 230 and the semiconductor zones 233, 234 forming the source zone, in order subsequently to deposit an electrode layer 270, which forms the source electrode of the component. This source electrode, which is composed for example of a highly doped polysilicon, short-circuits the body zone 230 and the source zone 233, 234. The electrode layer 270 is arranged in a manner insulated from the gate electrode 240. Since—as explained above—the section of the insulation layer 260 at the top side of the gate electrode 240 may be formed thicker than above the monocrystalline semiconductor zone 230 and above the highly doped zones 233, the insulation layer 260 may be partly removed in a simple manner, e.g. by means of a technical etching method, in such a way that it is taken away completely above the monocrystalline semiconductor zone 230 and above the semiconductor zones 233, 234 forming the source zone, while a section of the insulation layer 260 that insulates the gate electrode 240 remains above the latter.

Figure 5A:
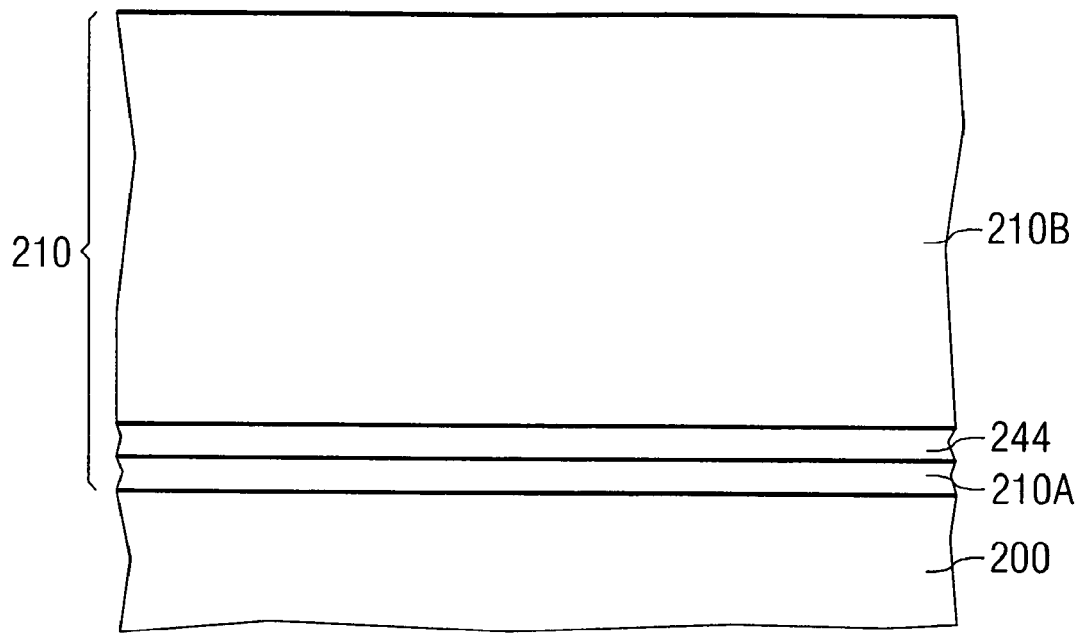
FIG. 5 illustrates a modification of the method according to FIG. 4, in which, alongside a gate electrode, a field electrode is additionally produced in a trench.

A modification of the production method in accordance with FIG. 4 is explained below with reference to FIG. 5, in which a field electrode is also produced alongside a gate electrode 240. Referring to FIG. 5a, for this purpose, an electrically conductive layer 244 is embedded in the auxiliary layer 210, which electrically conductive layer forms the later field electrode in sections. For this purpose, firstly a first section 210A of the auxiliary layer 210 is applied to the semiconductor substrate 200, the auxiliary layer 210 being for example a thermal oxide or a deposited oxide. The electrode layer 244 is subsequently applied to said first section 210A, to which electrode layer is applied in turn a further section 210B of the auxiliary layer 210, sad further section being substantially thicker compared with the first section 210A.

Figure 5B:
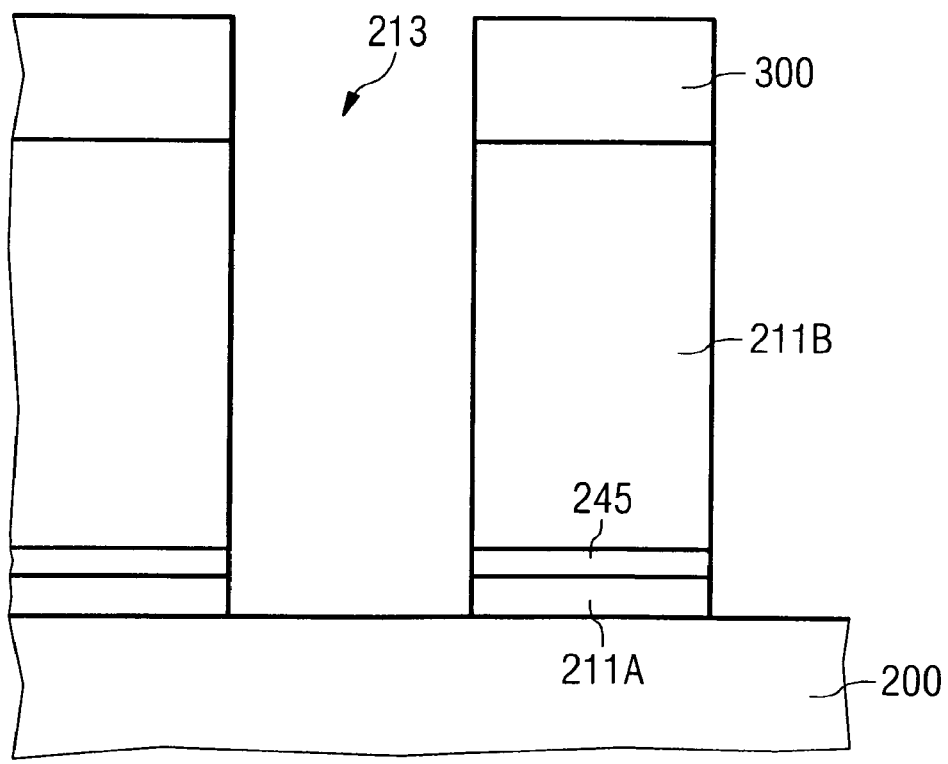

The auxiliary layer 210 and the electrode layer 244 are subsequently patterned jointly in order to produce trenches 213 which reach as far as the semiconductor substrate 200. The arrangement is represented in FIG. 5b after these method steps have been carried out. In FIG. 5b, a lower section of the residual section 210A of the auxiliary layer is designated by the reference symbol 211A and an upper section of the residual section 210B of the auxiliary layer is designated by the reference symbol 211B. The reference symbol 245 designates that section of the electrode layer 214 which remained between the sections 210A and 210B of the auxiliary layer 210.

Figure 5C:
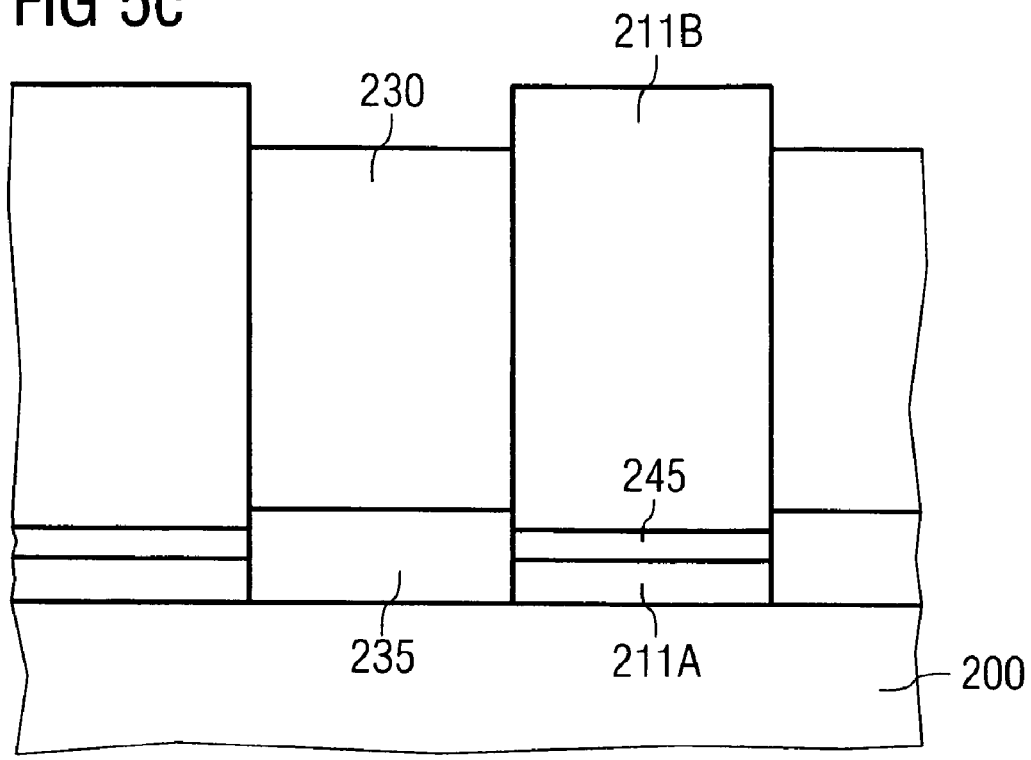

Monocrystalline semiconductor zones 235 and 230 are subsequently produced in the trenches 213 in the manner already explained, the result of which is represented in FIG. 5c. The semiconductor zone 235 may form the body zone of a MOSFET, by way of example. In this case, the interface between the semiconductor zone 235 and the semiconductor zone 230 is spaced apart further from the substrate and the interface between the section 245 of the electrode layer 244 and the section 211B of the auxiliary layer section 210B.

Figure 5D:
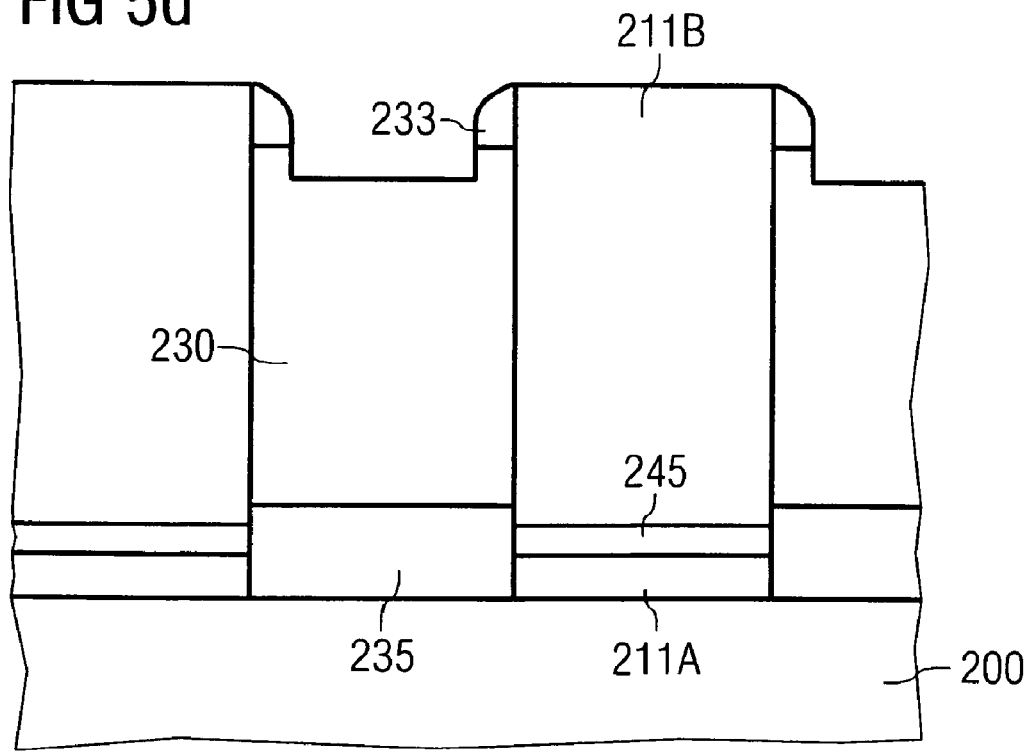

The production of these monocrystalline semiconductor zones 230 is followed by the production of the highly doped semiconductor layers 233 in the upper region of the upper auxiliary layer sections 211B, which have previously projected upwardly above the monocrystalline semiconductor zones 230. The result of the corresponding method steps is shown in FIG. 5d.

The upper sections 211B of the auxiliary layer, that is to say the sections 211B of the auxiliary layer 210 which are arranged above the electrode sections 245 are subsequently removed, which is effected for example by means of a wet-chemical etching method. The etching of the auxiliary layer is preferably effected selectively with respect to the electrode layer 245, as a result of which only the upper section 211B of the auxiliary layer, but not the electrode layer 245, is removed.

Figure 5E:
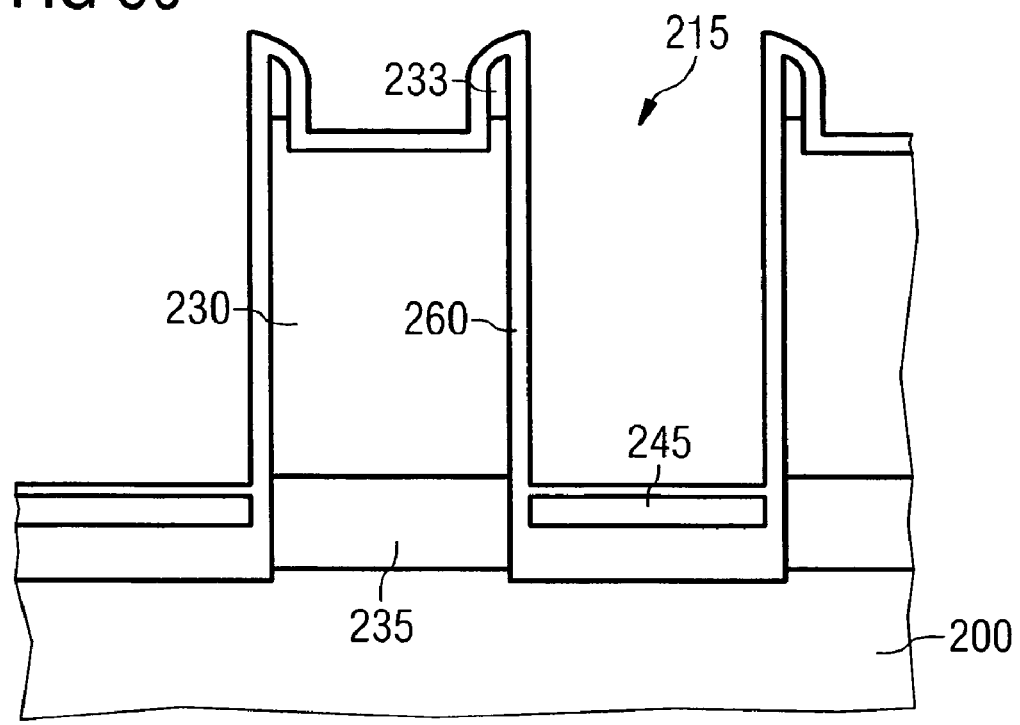

After the removal of the upper sections 211B of the auxiliary layer, which gives rise to trenches 215 between the monocrystalline semiconductor zones 230, an insulation layer 260 is produced on the end covered semiconductor regions and the upwardly uncovered regions of the electrodes 245. Said insulation layer 260 is an oxide layer, for example, which is produced by means an oxidation step. Said oxidation step is preferably controlled with regard to duration and temperature in such a way that an oxide layer is also formed between the monocrystalline semiconductor zones 230 and the electrodes 245. The thickness of the regions of the insulation layer 260 which are deposited above the electrodes 245 and the thickness of the monocrystalline semiconductor zone 235 are coordinated with one another in such a way that the top side of the monocrystalline semiconductor zone 235 is spaced apart further from the substrate 200 than the top side of that section of the insulation layer 260 which is arranged on the electrodes 245. The result of these steps is shown in FIG. 5e.

Figure 5F:
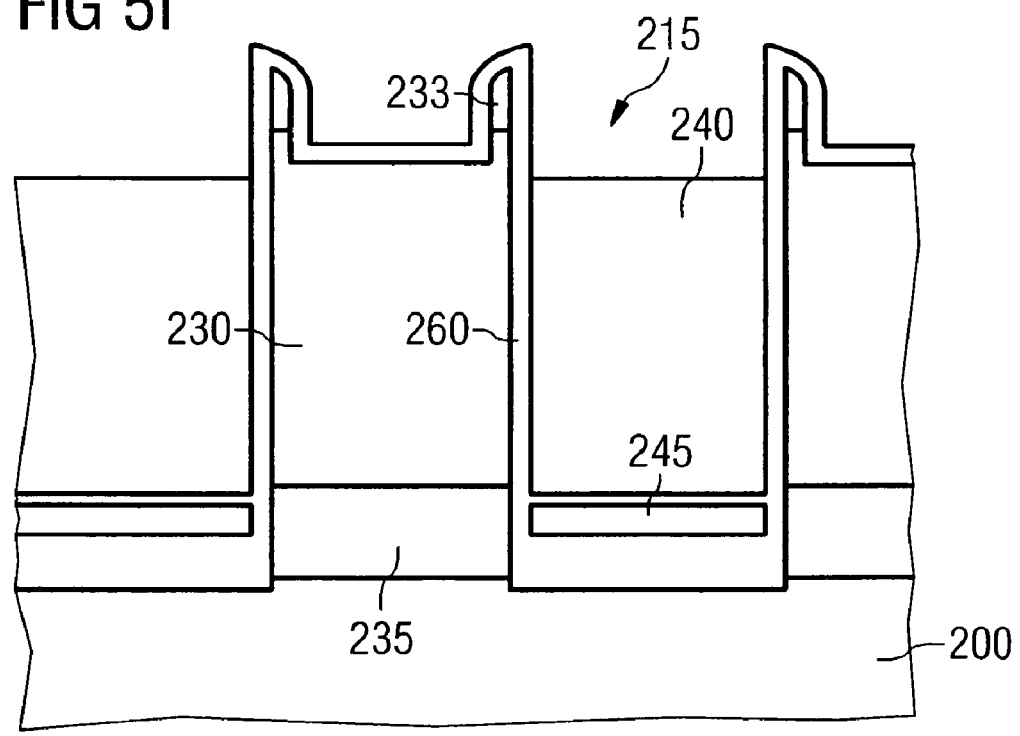

This oxidation step is followed by the production of the gate electrodes 240 in the trenches 215 above the field electrodes 245, the result of which is illustrated in FIG. 5f. The method steps required for producing said gate electrodes 240 correspond to the method steps already explained with reference to FIG. 4.

Figure 5G:
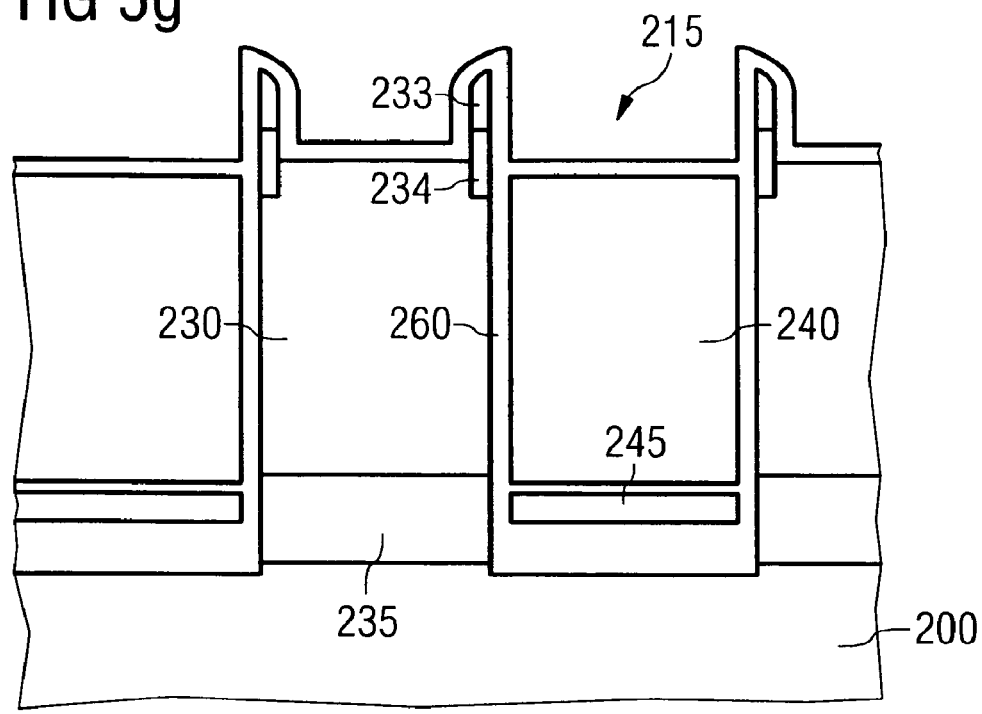

A diffusion and oxidation step, already explained above with reference to FIG. 4, is subsequently effected, by means of which an insulation layer is produced on the upwardly uncovered regions of the gate electrode 240, and by means of which dopant atoms indiffuse into the monocrystalline semiconductor zone 230 from the highly doped semiconductor zones 233 in order to form the source zone 234 of the component. The result of these steps is shown in FIG. 5g.

Figure 5H:
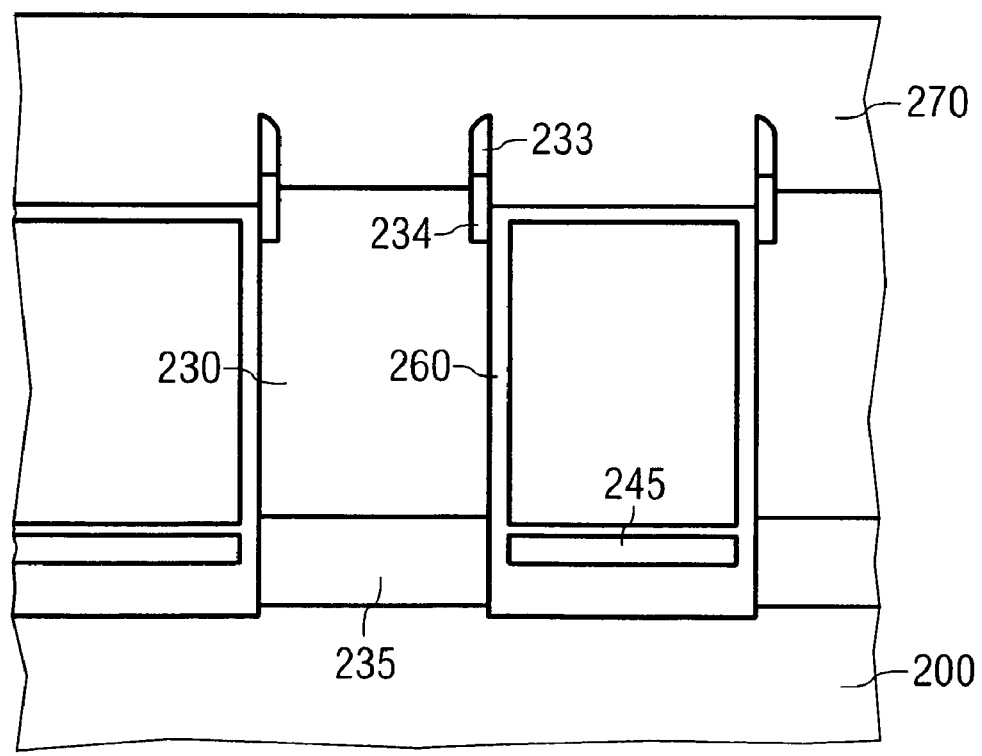

The insulation layer 260 is subsequently removed above the semiconductor zones forming the source and body zones before an electrode layer 270 is deposited, which short-circuits the body zone and the source zones, the result of which is represented in FIG. 5h.

LIST OF REFERENCE SYMBOLS

100 Semiconductor substrate
101 Surface of the semiconductor substrate
102, 104 Differently doped zone of the semiconductor substrate
106 Semiconductor zone doped complementarily with respect to the semiconductor substrate
110 Auxiliary layer, oxide layer
112 Pillar-type section of the auxiliary layer
114 Trench of the auxiliary layer
115 Sidewall of the trench
116 Trench
130 Semiconductor layer
132 Monocrystalline semiconductor layer
133 Source zone
134 Connecting zone
135 Body zone
140 Gate electrode
140 Insulation layer, spacer layer
142 Spacer
150 Protective layer
152 Region of the protective layer 154 Thin section of the protective layer
160 Insulation layer
162 Gate insulation, gate oxide
170 Connection contact
172 Spacer layer, spacer
180 Electrode layer
200 Semiconductor substrate
210 Auxiliary layer
211 Pillar-type section of the auxiliary layer
211A, 211B Sections of the auxiliary layer
213 Trench of the auxiliary layer
215 Trench
230 Monocrystalline semiconductor zone
233 Highly doped semiconductor zone, non-monocrystalline semiconductor zone
234 Source zone
235 Diffusion zone
240 Gate insulation
244 Electrode layer
245 Field electrode
260 Insulation layer
270 Electrode layer
300 Mask

What is claimed is:

1. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and
a contact layer arranged above the gate electrode and insulated from the gate electrode, wherein the connection electrode extends along the monocrystalline semiconductor layer to the contact layer and contacts the contact layer.

2. The transistor component according to claim 1 further comprising an insulation layer configured to insulate the connection electrode from the monocrystalline semiconductor layer.

3. The transistor component according to claim 1 wherein the monocrystalline semiconductor layer has a body zone doped complementarily with respect to the semiconductor substrate and a source zone adjoining the body zone in the vertical direction of a same conduction type as the semiconductor substrate, and wherein the connection electrode short-circuits the source zone and the body zone.

4. The transistor component according to claim 1 wherein the monocrystalline semiconductor layer extends beyond the gate electrode in the vertical direction.

5. The transistor component according to claim 1 wherein the gate electrode has a section in which the gate electrode is wider in comparison with remaining sections of the gate electrode.

6. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate,
wherein the monocrystalline semiconductor layer has a body zone doped complementarily with respect to the semiconductor substrate and a source zone adjoining the body zone in the vertical direction of a same conduction type as the semiconductor substrate, and wherein the connection electrode short-circuits the source zone and the body zone,
wherein the monocrystalline semiconductor layer has a semiconductor zone of the same conductivity type as the semiconductor substrate, the semiconductor zone disposed between the semiconductor substrate and the body zone.

7. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate;
wherein the semiconductor substrate has a more heavily doped section and a more weakly doped section, the more weakly doped section disposed adjacent to the gate electrode and the connection electrode.

8. A vertical transistor component comprising: a semiconductor substrate; a gate electrode disposed above the semiconductor substrate and insulated from the semiconductor substrate; a monocrystalline semiconductor layer disposed adjacent to the gate electrode in a lateral direction and insulated from the gate electrode, the monocrystalline semiconductor layer extending in a vertical direction as far as the semiconductor substrate, and wherein the monocrystalline semiconductor layer has a body zone doped complementarily with respect to the semiconductor substrate and a source zone adjoining the body zone in the vertical direction of a same conduction type as the semiconductor substrate, and wherein a connection electrode short-circuits the source zone and the body zone; the connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and an insulation layer configured to insulate the connection electrode from the monocrystalline semiconductor layer; and a contact layer arranged above the gate electrode and insulated from the gate electrode.

9. The transistor component according to claim 8 wherein the monocrystalline semiconductor layer has a semiconductor zone of the same conductivity type as the semiconductor substrate, the semiconductor zone disposed between the semiconductor substrate and the body zone.

10. The transistor component according to claim 8 wherein the monocrystalline semiconductor layer extends beyond the gate electrode in the vertical direction.

11. The transistor component according to claim 8 wherein the gate electrode has a section in which the gate electrode is wider in comparison with remaining sections of the gate electrode.

12. A vertical transistor component comprising: a semiconductor substrate; a gate electrode disposed above the semiconductor substrate and insulated from the semiconductor substrate; a monocrystalline semiconductor layer disposed adjacent to the gate electrode in a lateral direction and insulated from the gate electrode, the monocrystalline semiconductor layer extending in a vertical direction as far as the semiconductor substrate, and wherein the monocrystalline semiconductor layer has a body zone doped complementarily with respect to the semiconductor substrate and a source zone adjoining the body zone in the vertical direction of a same conduction type as the semiconductor substrate, and wherein a connection electrode short-circuits the source zone and the body zone; the connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and an insulation layer configured to insulate the connection electrode from the monocrystalline semiconductor layer; wherein the semiconductor substrate has a more heavily doped section and a more weakly doped section, the more weakly doped section disposed adjacent to the gate electrode and the connection electrode.

13. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate, and wherein the monocrystalline semiconductor layer extends beyond the gate electrode in the vertical direction;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and an insulation layer configured to insulate the connection electrode from the monocrystalline semiconductor layer; and
a contact layer arranged above the gate electrode and insulated from the gate electrode, wherein the connection electrode extends along the monocrystalline semiconductor layer to the contact layer and contacts the contact layer.

14. The transistor component according to claim 13 wherein the monocrystalline semiconductor layer has a body zone doped complementarily with respect to the semiconductor substrate and a source zone adjoining the body zone in the vertical direction of a same conduction type as the semiconductor substrate, and wherein the connection electrode short-circuits the source zone and the body zone.

15. The transistor component according to claim 13 wherein the gate electrode has a section in which the gate electrode is wider in comparison with remaining sections of the gate electrode.

16. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate, and wherein the monocrystalline semiconductor layer extends beyond the gate electrode in the vertical direction;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and an insulation layer configured to insulate the connection electrode from the monocrystalline semiconductor layer,
wherein the monocrystalline semiconductor layer has a body zone doped complementarily with respect to the semiconductor substrate and a source zone adjoining the body zone in the vertical direction of a same conduction type as the semiconductor substrate, and wherein the connection electrode short-circuits the source zone and the body zone,
wherein the monocrystalline semiconductor layer has a semiconductor zone of the same conductivity type as the semiconductor substrate, the semiconductor zone disposed between the semiconductor substrate and the body zone.

17. A vertical transistor component comprising:
a semiconductor substrate;
a gate electrode disposed above the semiconductor substrate and insulated from the semiconductor substrate;
a monocrystalline semiconductor layer disposed adjacent to the gate electrode in a lateral direction and insulated from the gate electrode, the monocrystalline semiconductor layer extending in a vertical direction as far as the semiconductor substrate, and wherein the monocrystalline semiconductor layer extends beyond the gate electrode in the vertical direction;
a connection electrode arranged adjacent to the monocrystalline semiconductor layer above the semiconductor substrate, wherein the connection electrode makes contact with the semiconductor substrate in a region of a semiconductor zone that is doped complementarily with respect to remaining regions of the semiconductor substrate; and an insulation layer configured to insulate the connection electrode from the monocrystalline semiconductor layer,
wherein the semiconductor substrate has a more heavily doped section and a more weakly doped section, the more weakly doped section disposed adjacent to the gate electrode and the connection electrode.

* * * * *

UNITED STATES PATENT AND TRADEMARK OFFICE
CERTIFICATE OF CORRECTION

PATENT NO. : 8,093,654 B2
APPLICATION NO. : 12/834000
DATED : January 10, 2012
INVENTOR(S) : Martin Poelzl et al.

Page 1 of 1

It is certified that error appears in the above-identified patent and that said Letters Patent is hereby corrected as shown below:

On the Title Page, Item (73) Assignee: ~~Infineon Technologies Austria AG, Villach (AT)~~ should read Infineon Technologies AG, Munich (DE)

Signed and Sealed this
Seventh Day of January, 2014

Margaret A. Focarino
*Commissioner for Patents of the United States Patent and Trademark Office*